United States Patent
Kranen et al.

(10) Patent No.: US 8,527,911 B1
(45) Date of Patent: Sep. 3, 2013

(54) COMPREHENDING A CIRCUIT DESIGN

(75) Inventors: Kathryn Drews Kranen, Menlo Park, CA (US); Chung-Wah Norris Ip, Cupertino, CA (US); Rajeev Kumar Ranjan, Sunnyvale, CA (US); Georgia Penido Safe, Minas Gerais (BR); Claudionor José Nunes Coelho, Minas Gerais (BR); Yann Alain Antonioli, Scotts Valley, CA (US)

(73) Assignee: Jasper Design Automation, Inc., Mountain View, CA (US)

( * ) Notice: Subject to any disclaimer, the term of this patent is extended or adjusted under 35 U.S.C. 154(b) by 225 days.

(21) Appl. No.: 12/797,471

(22) Filed: Jun. 9, 2010

Related U.S. Application Data

(60) Provisional application No. 61/185,548, filed on Jun. 9, 2009.

(51) Int. Cl.
*G06F 17/50* (2006.01)

(52) U.S. Cl.
USPC ............................................. 716/51; 716/136

(58) Field of Classification Search
USPC ......................................................... 716/51
See application file for complete search history.

(56) References Cited

U.S. PATENT DOCUMENTS

| | | | |
|---|---|---|---|
| 5,111,413 A * | 5/1992 | Lazansky et al. ................ | 703/14 |
| 5,867,399 A | 2/1999 | Rostoker et al. | |
| 5,907,698 A | 5/1999 | Kucukcakar et al. | |
| 6,326,987 B2 | 12/2001 | Alexander | |
| 6,513,143 B1 | 1/2003 | Bloom et al. | |
| 6,701,501 B2 | 3/2004 | Waters et al. | |
| 6,751,582 B1 | 6/2004 | Andersen et al. | |
| 6,871,331 B1 | 3/2005 | Bloom et al. | |
| 7,031,899 B2 | 4/2006 | Hsu et al. | |
| 7,079,997 B1 | 7/2006 | Hsu et al. | |
| 7,137,078 B2 | 11/2006 | Singhal et al. | |
| 7,277,840 B2 | 10/2007 | Marlett | |
| 7,308,672 B2 | 12/2007 | Waters et al. | |
| 7,325,209 B2 | 1/2008 | Mitra et al. | |
| 7,346,861 B1 | 3/2008 | Lee | |
| 7,360,189 B1 | 4/2008 | Molson | |
| 7,412,674 B1 * | 8/2008 | Singhal et al. ................ | 716/106 |

(Continued)

FOREIGN PATENT DOCUMENTS

JP    2006-244119    9/2006

OTHER PUBLICATIONS

United States Office Action, U.S. Appl. No. 12/797,473, Dec. 8, 2011, nine pages.

(Continued)

*Primary Examiner* — Paul Dinh
*Assistant Examiner* — Bryce Aisaka
(74) *Attorney, Agent, or Firm* — Fenwick & West LLP

(57) ABSTRACT

An executable circuit design is used to generate waveforms, from which behaviors of the circuit are captured. The behaviors and various combinations thereof can then be saved in a database, along with descriptions and other metadata about them, thereby generating a behavioral index of the circuit design code. Behavioral indexing of circuit designs allows a user to maintain an indexed behavior database, track changes in behaviors as the circuit design's executable description evolves, and figure out how the executable description can be reused in different projects. When applied to digital design development, it facilities the current design and verification effort, as well as design reuse down the line.

16 Claims, 20 Drawing Sheets

(56) References Cited

U.S. PATENT DOCUMENTS

| | | |
|---|---|---|
| 7,415,686 B2 | 8/2008 | Andreev et al. |
| 7,418,678 B1 | 8/2008 | Ip et al. |
| 7,421,668 B1 | 9/2008 | Ip et al. |
| 7,437,694 B1 | 10/2008 | Loh et al. |
| 7,500,228 B2 | 3/2009 | Holmes et al. |
| 7,512,728 B2 | 3/2009 | Tseng |
| 7,530,046 B1 | 5/2009 | Nixon et al. |
| RE40,925 E | 9/2009 | Ly et al. |
| 7,603,636 B2 | 10/2009 | Yamada |
| 7,908,577 B2 | 3/2011 | Tsuchiya |
| 8,046,206 B1 | 10/2011 | Hood et al. |
| 8,176,453 B2 | 5/2012 | Yang et al. |
| 8,205,175 B2 | 6/2012 | Waters et al. |
| 8,205,187 B1 | 6/2012 | Coelho et al. |
| 2002/0147576 A1 | 10/2002 | Hsu et al. |
| 2002/0194543 A1 | 12/2002 | Veenstra et al. |
| 2003/0135834 A1 | 7/2003 | Tojima et al. |
| 2003/0233504 A1 | 12/2003 | Marlett |
| 2004/0243374 A1 | 12/2004 | Kundert |
| 2005/0091025 A1 | 4/2005 | Wilson |
| 2005/0289486 A1 | 12/2005 | Caron et al. |
| 2006/0190239 A1* | 8/2006 | Piper et al. .................. 703/26 |
| 2007/0234249 A1 | 10/2007 | Kowatari et al. |
| 2008/0005713 A1 | 1/2008 | Singh et al. |
| 2008/0059928 A1 | 3/2008 | Takei et al. |
| 2008/0082946 A1 | 4/2008 | Zilic et al. |
| 2008/0104556 A1 | 5/2008 | Yamada |
| 2009/0064059 A1 | 3/2009 | Tsuchiya |
| 2009/0193373 A1 | 7/2009 | Abbaspour et al. |
| 2009/0271167 A1 | 10/2009 | Zhu et al. |
| 2010/0199237 A1 | 8/2010 | Kim et al. |
| 2010/0293517 A1 | 11/2010 | Graeve et al. |

OTHER PUBLICATIONS

U.S. Appl. No. 12/797,467, filed Jun. 9, 2010, Inventors: Kathryn Drews Kranen et al.

U.S. Appl. No. 12/797,468, filed Jun. 9, 2010, Inventors: Chung-Wah Norris Ip et al.

U.S. Appl. No. 12/797,476, filed Jun. 9, 2010, Inventors: Chung-Wah Norris Ip et al.

U.S. Appl. No. 13/618,632, filed Sep. 14, 2012, Inventors: Kathryn Drews Kranen et al.

United States Office Action, U.S. Appl. No. 12/797,467, Aug. 3, 2012, 11 pages.

United States Office Action, U.S. Appl. No. 12/797,476, Oct. 15, 2012, 14 pages.

Mentor Graphics, "ModelSim® Advanced Verification and Debugging SE User's Manual Version 6.0b," Nov. 15, 2004, 19 pages.

Dahan, A. et al., "Combining System Level Modeling with Assertion Based Verification," *Proceedings of the Sixth International Symposium on Quality Electronic Design,* 2005, pp. 310-315.

United States Office Action, U.S. Appl. No. 12/797,467, filed Apr. 5, 2013, thirteen pages.

United States Office Action, U.S. Appl. No. 12/797,476, filed May 21, 2013, twelve pages.

United States Office Action, U.S. Appl. No. 13/618,632, filed Mar. 28, 2013, eight pages.

* cited by examiner

The annotation is a selection of one or more signal/cycle pairs, which causes a behavior to be generated in the form:

a == 1 ##2 (a==0 && b == 1)

which means a == 1 is followed by (a == 0 && b == 1) in two cycles.

COMPREHENDING A CIRCUIT DESIGN

CROSS REFERENCE TO RELATED APPLICATIONS

This invention claims the benefit of U.S. Provisional Application No. 61/185,548, filed on Jun. 9, 2009, which is incorporated by reference in its entirety.

BACKGROUND

This invention relates generally to electronic design automation for circuit designs, and more particularly to using user input from waveforms to capture and index the behaviors of a circuit design as well as applications for the indexed behaviors.

With the increasing size and complexity of electronic circuits, design quality and productivity are becoming even more difficult to achieve. This is complicated by a number of factors. For example, circuit designs are built incrementally, but there is no practical method for verifying design changes incrementally. During the design process, even relatively insignificant changes to a circuit design may cause unintended side-effects. Due to the complexity of typical designs, the cost of uncovering a design bug increases non-linearly down the design flow.

Existing solutions for RTL designers include, for example, directed testing and formal assertion based verification. Directed testing is not within the typical designer's area of expertise, so the effort is non-trivial, even to achieve just a little verification coverage. Moreover, there is no persistent return-on-investment because the directed testing effort is usually thrown away. The other option, formal assertion based verification, is difficult to deploy because most designers lack knowledge of assertions.

Circuit designers have attempted to make their circuit designs more understandable in a number of ways. For example, when creating the executable description of a circuit design, designers sometimes place textual comments within the executable description of the circuit design, or they write a textual specification to go along with the circuit design. These techniques suffer from the severe limitation of being static. The designer must rely on the original writer to capture and maintain the textual description, and its accuracy depends on whether the writer has understood the executable description correctly and whether the static textual description was modified accordingly when the executable description is modified. If the original writer did not capture the exact aspect that the user is interested in, the user has no way to figure out whether the things he or she would like to do with the executable description can be done at all, and if so, how it can be done.

Since the specification can easily go out of date with the latest version of the design, the communication on design behaviors is typically supplemented by information received through hallway conversation, email, white-board discussion. These ad hoc methods of understanding a circuit design are clearly not efficient or reliable. Accordingly, there exists a need for improved tools to help circuit designs understand and work with the complex circuit designs that exist today.

SUMMARY

To improve the quality of circuit designs and enhance the productivity of circuit designers, embodiments of the invention provide mechanisms for tagging, indexing, and querying behaviors of a circuit design. In one embodiment, a number of waveforms are generated for a circuit design and then displayed to a designer. The designer specifies certain behaviors manifested in the waveforms that the designer believes might be interesting. The designer may also provide additional information about the behaviors, such as a textual description about the behavior. Each of the selected behaviors is then stored in a data store and associated with an executable definition of the behavior, along with other information about the behavior such as its textual description. This process may be repeated for a number of different waveforms to generate a rich set of behaviors for the circuit design.

The data store thus provides an index of various ways in which the circuit design may behave, the set of indexed behaviors corresponding to the designer's interest in the circuit design. Moreover, since the indexed behaviors may be associated directly with the circuit design, they may automatically change when the circuit design is modified, unlike static descriptions that may exist in the executable code or in an accompanying design specification. Embodiments of the invention thus enable designers to achieve higher design quality, productivity, and more precise communication that can be kept up to date as the circuit design evolves.

The indexed behaviors also enable a number of useful circuit analysis tools, which query the indexed behaviors and present the information about the circuit design in a number of useful ways. In one embodiment, for example, a template document is created from automatically extracted behaviors of a particular circuit design for the user to populate a textual description. In another embodiment, the indexed behaviors and recipes are used as the basis for creation of custom recipes to generate more waveforms from the design. In other embodiments, the indexed behaviors aid comprehension of waveforms and design description. In yet another embodiment, the indexed behaviors allow the user to expand and evolve the data store as the usage of the design evolves and as the design evolves. In yet other embodiments, the indexed behaviors are used to isolate the differences in multiple revisions of the design description, and to extract the implication of modification to the design description. In yet another embodiment, the indexed behaviors can be used to capture programming steps and to analyze and manipulate programming sequences for programming the design.

BRIEF DESCRIPTION OF THE DRAWINGS

FIG. 18 is a screen shot showing how the cone-of-influence is highlighted with respect to a behavior when a behavior is selected from an entry in the behavior table or a rectangle in the waveform.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Behavioral Indexing

Behavioral indexing is a technique that allows a designer to maintain an indexed behavior database, track changes in behaviors as the executable description of the circuit design evolves, and figure out how the executable description can be reused in different projects. When applied to digital design development, behavioral indexing facilities the current design and verification effort, as well as design reuse down the line. During behavioral indexing, key circuit behaviors may be identified and captured in a machine-useable form that can be applied to the executable description with precise mathematical analysis to draw conclusion about how the executable description works.

As used herein, the term "behavior" refers to the actions and reactions of an executable description, usually in relation to the environment, the architectural specification, or the micro-architectural specification, and sometime to the implementation details as well. It may also be referred to the actions and reaction of the environment of the executable description. A behavior can be described by an executable expression that captures a temporal relationship of the states and events in the executable description, which can be stored in a database for referring the behavior at a later time. For example, a simple behavior may be captured as a Boolean expression, stating the relationship of signals at the same time step. In addition, for temporal relationship with multiple time steps, the sequence operators in two standard languages in the industry, PSL and SVA, can be used to capture a behavior in an executable specification. These two languages were developed to enable specification of Assumptions, Assertions, Coverage Points for assertion-based verification. In these languages, functional coverage points are also used in functional coverage measurements, typically defined as the determination of how much functionality of the design has been exercised by the verification environment. Instead of performing assertion-based verification and coverage measurements, one embodiment of behavior indexing can reuse these languages to capture behaviors as executable expressions.

Figure 1:
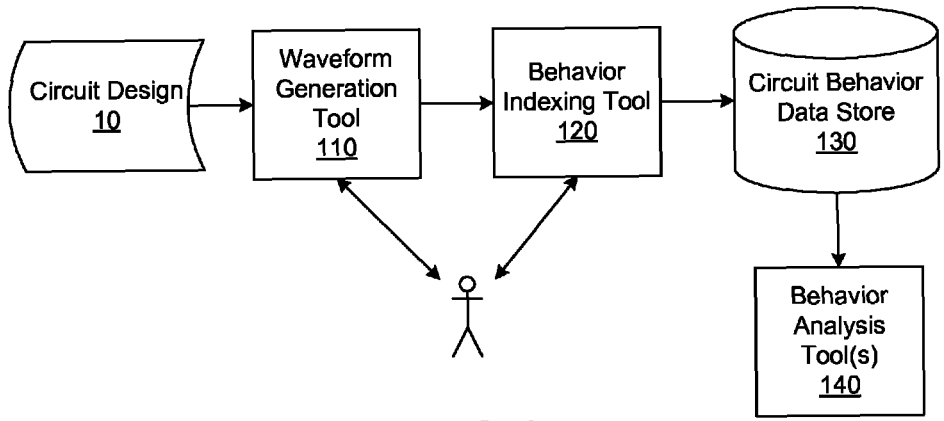
FIG. 1 is a diagram of a system for indexing behaviors of a circuit design and using the indexed behaviors to for analysis of the circuit design, in accordance with an embodiment of the invention.
Figure 2:
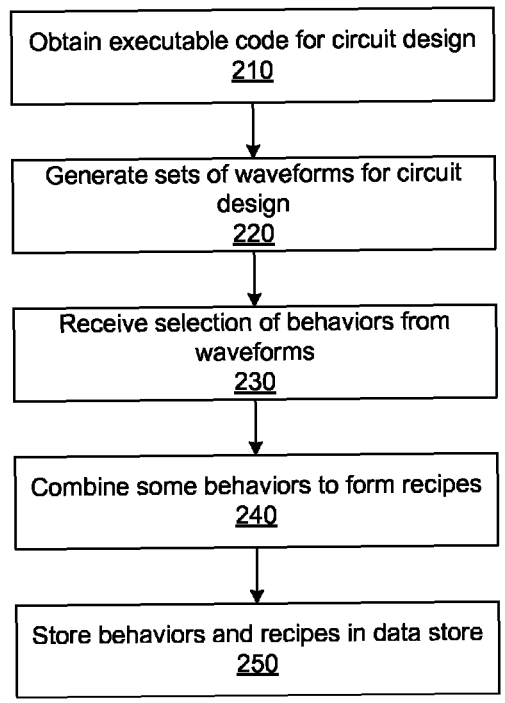
FIG. 2 is a flow diagram of a method for indexing behaviors of a circuit design, in accordance with an embodiment of the invention.

FIG. 1 illustrates one embodiment of a system for indexing behaviors of a circuit design, and FIG. 2 illustrate one embodiment of a process for indexing behaviors of a circuit design using the system of FIG. 1. The process is performed for a particular circuit design 10. The circuit design 10 may exist as a machine-executable description, such as circuit digital design model, register-transfer-level (RTL) digital design model, a system-level design model, or any other appropriate model for describing a circuit design.

The waveform generation tool 110 obtains 210 the circuit design 10, which comprises executable code for the design. The waveform generation tool 110 uses this executable code to generate 220 sets of waveforms for the circuit design, which are displayed to the circuit designer. The designer may interact with the waveform generation tool 110 to specify the waveforms to be generated according to any of a variety of means. In one embodiment, to generate the desired waveforms, the designer may specify features that the designer would like to see in the waveform.

Figure 3:
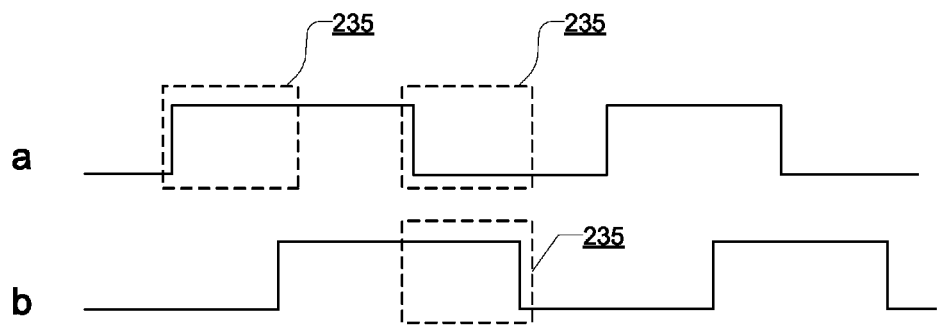
FIG. 3 shows an example of a displayed waveform and the selection of a behavior expressed therein.

When the waveform is displayed to a designer, the designer can select behaviors that are displayed in the waveform. If the designer finds the behavior to be meaningful, for example, the designer tags and/or labels the behavior by selecting it, and the behavior indexing tool 120 receives 230 the designer's selection. In one embodiment, the selection may be made via a graphical user interface, as illustrated in the example of FIG. 3. A waveform or a trace typically contains the sequences of values for the variables in the executable description. The designer selects the desired signal/cycle pairs 235 in the waveform, and the system converts the selection into an executable sequence. One embodiment of the invention captures "positive behavior," capturing sequences that are known to be exercisable, with the current trace as the witness of this fact. Another embodiment of the invention captures "negative behavior," which includes a sequence editor to take the existing sequence from the waveform selection, and receives an edit from the user to capture a revised sequence to guide future waveform generation.

A behavior may be defined as an elastic, temporal relationship amongst states. The behavior may be captured in many levels of granularity, such as nested, overlapping, among others. For a typical circuit design, the designer may specify hundreds of intended behaviors, where there might be thousands of functional coverage points for simulation. In a typical use, a behavior may be first observed in a specific version and configuration of a design, under specific environment assumptions. By defining the behavior "elastically," the designer may often be oblivious of the exact timing and activities, since an elastic behavior represents an abstraction on a design's functionality as something the design does over time. For example, the behavior captured with the selection in the waveform shown in FIG. 3 can be made "elastic" by converting the definition to have value 1 for unspecified but finite number of cycles (instead of a fixed value of 2) before getting value 0 for a and value 1 for b.

Once the user specifies one or more behaviors from one or more waveforms, the behavioral indexing tool 120 stores the behaviors in a circuit behavior data store 130. The exact format for the machine-usable behavior may depend on the languages of the executable description. For RTL design model, for example, PSL sequences, SVA sequences, or simple Boolean predicates may be used to capture behaviors. The stored behaviors that have been captured, tagged, and labeled by the designer may then be used by one or more behavior analysis tools 140, which may be configured to query the circuit behavior data store 130 and perform various types of analyses about the circuit design for a designer. A number of such behavior analysis tools 140 are described herein, although it can be appreciated that the indexed behaviors may be used in many other ways.

The set of behaviors indexed in the behavior data store 130 form a vocabulary by which humans can express queries of design functionality. In some embodiments of the invention, more complex "recipes" are created by combining 240 multiple behaviors and adding options on waveform related configurations. A typical recipe is a collection of at least one behavior, and optionally includes a configuration. Example configurations include the cycle interval in which each behavior should occur, a minimum length of the overall waveform, and a maximum length of the overall waveform, among many others. The waveform generation process takes the collection of behaviors and generates a waveform that exhibits each behavior at least once, and if the optional cycle interval is specified, with the occurrence within the specified interval. One embodiment of the invention picks a subset of behaviors at random to create new recipe. Another embodiment picks a subset of behaviors based on the degree of overlap in their cone-of-influence within the executable description. Yet another embodiment receives instruction from the user on which subset of behaviors to use to form a new recipe. The generated recipes are also added to the circuit behavior data store 130.

The waveform generation and display, the behavior selection, and the recipe generation processes are typically repeated multiple times. The end result is to populate the behavior data store 130 with a rich pool of behaviors and recipes that describe the circuit design.

As recipes and behaviors are specified and captured into the behavior data store 130, the designer may specify textual descriptions for the recipes and behaviors. For example, the designer may provide a textual comment about the behavior or recipe that describes why the designer believes the behavior or recipe to be meaningful for the circuit design. The resulting data store 130 thus contains links among the recipes, behaviors, textual descriptions.

Figure 4:
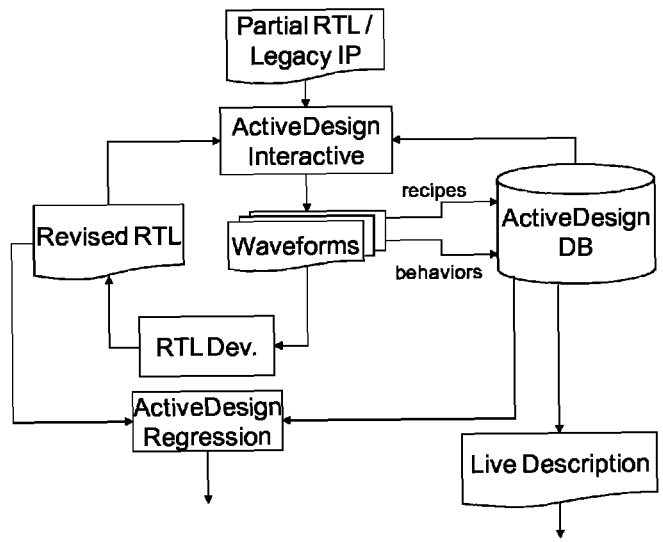
FIG. 4 is a diagram of a system for indexing behaviors of a circuit design, in accordance with an embodiment of the invention.

FIG. 4 illustrates one embodiment of the invention. As shown, starting with an executable description such as an RTL design, the embodiment generates waveforms out of very simple "recipes" received from the user. The embodiment stores the recipes used to generate the waveforms into a database, and receives "waveform highlights" from the user, and store them as "behaviors" into the database. Based on the current set of recipes and behaviors in the database, the embodiment then composes other recipes, either automatically or based on user-guidance, and creates more waveforms.

The initial recipes can be any of the following items, but not limited to the following items: (1) a specific line in the executable description to be illustrated; (2) a behavior captured as a Boolean expression referring to the variables in the executable description, such as "a+b", where the resulting waveform shows this expression to have value 1 in some time step; (3) a behavior captured as a temporal sequence referring to the variables in the executable description, such as "a ##1 b", where the resulting waveform shows "a" to have value 1 in some time step and "b" to have value 1 in the time step immediately after; (4) a behavior captured as a Boolean expression, but with a specific restriction on the time interval the expression must be 1; or (5) a behavior captured as a temporal sequence, but with a specific restriction on the time interval the sequence must be observed.

Given a recipe, a static analysis of the executable description is used to generate a waveform with all targets in the recipe satisfied in the waveform. U.S. Pat. No. 7,421,668, which is incorporated by reference in its entirety, describes other configurations that can be used to specify a waveform to be displayed to a designer.

Figure 5:
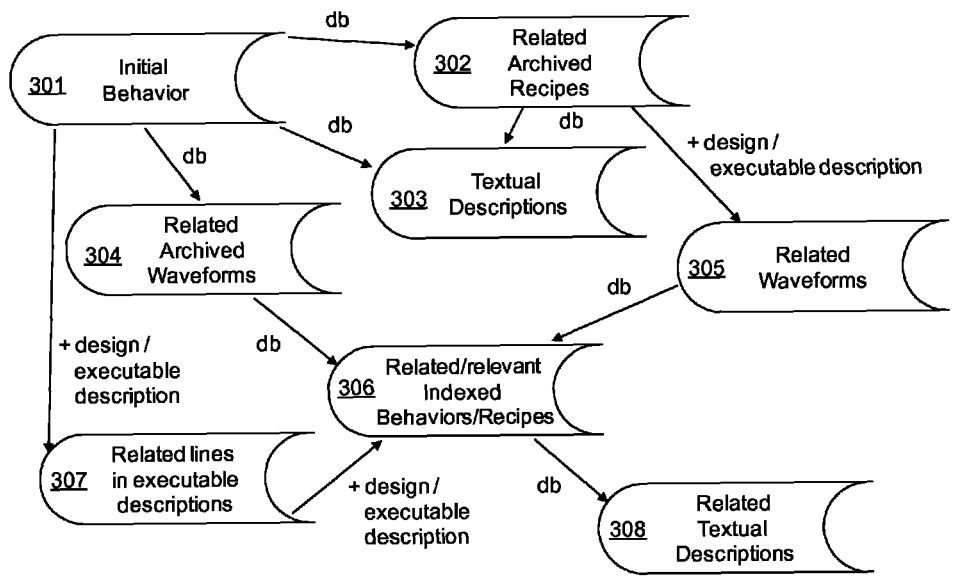
FIG. 5 illustrates the circuit behavior data store, in accordance with an embodiment of the invention.

FIG. 5 illustrates one embodiment of the circuit behavior data store 130. As illustrated, the data store 130 links each behavior 301 to its executable form and to its textual description 303. Recipes 302 in the database related to a behavior may be extracted by checking whether a recipe uses the behavior. Archived waveforms 304 (also captured in the data store 130) and waveforms 305 (generated from recipes in the data store 130) related to a behavior can be extracted by checking whether the sequence described in this behavior happens in the waveform. Recipes 306 used to generate the related waveforms and Behaviors 306 that happens in the related waveforms are therefore relevant to the behavior. While embodiments of the invention call a behavior that happens in a waveform to be "related" to the waveform, they also further classify a behavior to be "relevant" to the recipe used to generate the waveform if the items in the recipe are relevantly determined by the activities captured in the behavior, as disclosed in U.S. Pat. No. 7,137,078 and U.S. Pat. No. 7,437,694, each of which is incorporated by reference in its entirety. And related behaviors 306 extracted through the relevant waveforms lead to a set of related textual description 308, one for each related behaviors.

In one embodiment, the data store 130 uses cone-of-influence traversal of the executable description of the circuit design. From a particular behavior 301, using the executable sequence for the behavior, the cone-of-influence traversal of the executable description can be used to highlight the lines of executable descriptions 307 that are affecting this behavior. If a specific line of executable description is also in the cone-of-influence of another behavior, the data store 130 links it to the related behaviors 306.

In one embodiment, the relevant logic can be extracted for each waveform. If a specific line of executable description is in the relevant logic area of a waveform generated from a recipe, the invention links it to the related waveform and recipe. U.S. Pat. No. 7,137,078, which is incorporated by reference in its entirety, describes how the lines of an executable description relevant to a signal/cycle pair in a waveform can be extracted. The relevant logic can be extracted by performing this operation recursively. Once the relevant logic area of a waveform is generated, embodiments of the invention use techniques disclosed in U.S. Pat. No. 7,473,694, which is incorporated by reference in its entirety, to identify signals that are relevantly determined by this said relevant logic area of a waveform. From these relevantly determined signals and their activities, relevant behaviors are extracted from the data store.

This resulting data store 130 can be applied to different revision of the executable description to generate the waveforms specific to the revision of the description being used. The data store 130 can also be used for regression purposes, generating a waveform for each available recipe and reporting the differences when comparing to the previous revision of the design. The data store 130 can also be used for documentation purpose, supplementing or replacing static documents or descriptions of the circuit design.

In use, the data store 130 can be created by one person (e.g., a person dedicated to creating the behavioral index) while enabling many clients or other designers can use the behavioral index. The waveform used to specify a new behavior need not be generated from a recipe, as described above. Instead, the waveform may be obtained from a variety of sources, such as a waveform editor, in which a user draws the waveform. The waveform may also be obtained form a waveform library, from a simulation of the design, or from any other suitable source. Moreover, the recipe used for waveform generation need not be obtained from a signal or from composing a set of behaviors. Alternatively, the recipe may be obtained by taking an assertion, an assumption, or a requirement about the executable description of the circuit design, or from a recipe editor or library. If the waveform generation tool 110 is not able to find a legal waveform according to the recipe, this fact may also be important to be captured, since it may be important for enabling a "what-if analysis" on the executable description of the circuit design.

Behavior and Property Acquisition

Embodiments of the invention facilitate the capture of behaviors to be stored in the circuit behavior data store 130 and used by one or more of the behavior analysis tools 140. Embodiments of the invention also enable the capture of assumptions, assertions, and functional coverage points from waveforms.

Figure 6:
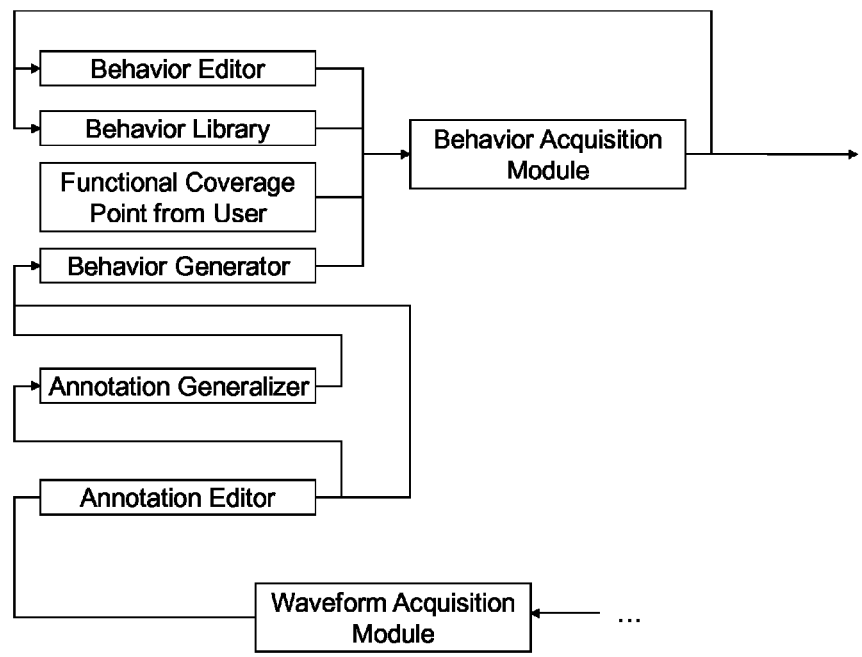
FIG. 6 shows various mechanisms by which a behavior can be acquired, in accordance with embodiments of the invention.

FIG. 6 shows various mechanisms by which a behavior can be acquired, including from the behavior data store, from a behavior editor, and also by converting functional coverage point into behavior. Furthermore, as described previously in connection with FIG. 3, behaviors can be generated from selections on a waveform. In addition to the basic selection mechanisms shown in FIG. 3, more complex "behavior acquisition annotations" can be received and processed to allow more general behavior description.

A waveform may represent positive behavior and/or negative behavior for a circuit design for a circuit design under various operating conditions. But because waveforms illustrate just one example of the behavior of a circuit design, one embodiment of the invention allow the waveform to be annotated with extra information to express a range of behaviors. These behavior acquisition annotations can be generalized further to broaden the scope of behavior to be "elastic". From these generalized annotations are created a useful set of behaviors, which apply to more than just the specific circuit behavior illustrated in the initial waveform. In other embodiments, these annotations can also be used to generate assumptions, assertions, and coverage points for use in formal verification, simulation, etc.

In one embodiment, a waveform acquisition module receives a waveform, which may be imported or created by the user. The waveform may be annotated using a behavior acquisition annotation editor, where one or more annotations are added. Several types of annotations may be applied, including annotations that define a relationship between two events within the waveform. Events in a waveform may include the edges of a signal (including the change in value of a word, or multi-bit data signal), a condition that evaluates the value of one or more signals, or other event that describes the state of the waveform. Once added, the annotations are generalized, preferably so that each annotation defines only the minimally necessary information in which the requirement is desired to apply. In this way, the annotation applies to the broadest possible set of operating conditions, and the resulting behavior will not be unduly narrow. Additional annotations can be also be inferred from the existing set of annotations to capture different aspects of the behavior that the user may not have explicitly captured in the original set of annotations. Once the annotations have been generalized, a behavior generator converts the generalized annotations into one or more behaviors, which accurately reflect the intent of the designer as expressed in the waveform, the annotations, and ultimately the generalization.

In this way, a user may use waveforms to specify behaviors graphically rather than having to write them manually. This allows users to create effective behaviors for complex circuit designs. Moreover, the solution integrates the visual feedback that waveforms provide with the behavior generation process, thus improving the designer's ability to create behaviors that accurately reflect the intent behind the circuit design.

A variety of types of behavior acquisition annotations may be available to allow the designer to express behaviors. Different types of annotations give the designer more flexibility in specifying aspects of the waveform activities that will eventually lead to the generation of versatile behaviors. In one embodiment, each annotation may fall within a specific class of annotations, including: causality arrows, stability annotations, tag annotations, local and global annotations, and unfolding annotations. Specific examples of annotations in each of these classes are described in more detail below for instructional purposes. As these types of annotations are merely tools for specifying the behavior of a waveform, it will be appreciated that other types of annotations may be defined for specifying other types of behavior. Therefore, other embodiments of the invention may allow for different types of annotations not specifically described herein.

One class of annotations includes causality arrows. In one embodiment, a causality arrow type annotation includes a triggering event (i.e., the beginning of the arrow); a triggered event (the end of the arrow); an optional guard that specifies when the relationship between the two events applies; and a time interval that specifies a time lag between the two events. The triggering and triggered events may be any aspect shown in the waveform that is capable of appearing in a behavior, such as the rising or falling edge of a signal or a value of a signal at any given time shown in the waveform. A triggering event is typically an edge event, and a triggered event can be an edge event or a value event. The time interval may be a constant delay (including 0), a range bounded by constants (e.g., [1:4]), an unbounded range (e.g., [1:$], where $ represents infinity), a delay specified by an expression (e.g. [a-b]), or an interval specified by an expression (e.g., [a−b:a+b]).

Figure 7:
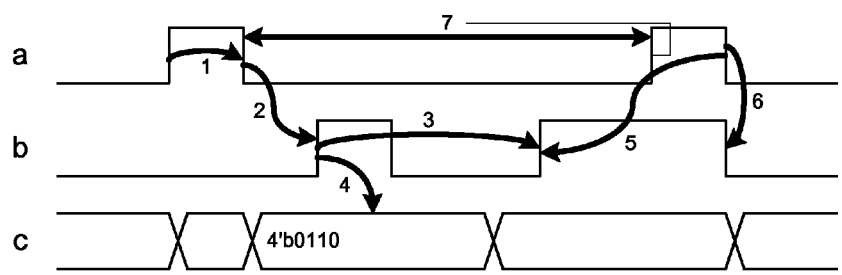
FIG. 7 illustrates an example waveform, according to one embodiment of the invention.

FIG. 7 illustrates an example waveform that includes signals a, b, and c, according to one embodiment of the invention. This waveform is annotated with causality arrows, having a set of annotations labeled 1 through 7 overlaid on the waveform. In the convention used in the drawing, the annotation is depicted as an arrow drawn over the waveform, pointing from the triggering event to the triggered event. Taking annotation 1, for example, the triggering event is the first shown rising edge of signal a, and the triggered event is the immediately following falling edge of signal a. Alternatively, the triggering and/or triggered events may be a condition of a signal at a given time—e.g., where the condition an expression that evaluates the value of the signal during the specified time period. For example, annotation 4 points to the value of data signal c, so the triggered event of that annotation may be a function or expression of the condition of signal c at the time shown. The signal may be a single bit (i.e., resolving to a 1 or 0), or it may be n bits. The triggering and triggered events need not be on the same signal, as for annotations 2, 4, and 5.

A causality arrow type annotation thus imports some type of causality relationship between two events in a waveform that exists when certain conditions are met. As a number of types of causality relationships are possible, a causality arrow may further be categorized into a number of subtypes based on its logical effect. Example subtypes include, but are not limited to, the following types or causality arrows, with the logical effect of each type of causality arrow explained:

a) Leads to: For a "leads to"-type annotation, if the triggering event occurs, the triggered event must occur after the triggering event. Effectively, this creates an implication relationship, which can be described by an "if . . . then" statement. It is noted that the annotation has effect only if the triggering event occurs, since it is not necessary that the triggering event to have occurred if the triggered event occurs. Causality arrows 1 through 4 and 6 in FIG. 7, for example, could be of this type.

b) Precedence: For a "precedence"-type annotation, if the triggered event occurs, the triggering event must have occurred beforehand. It is noted that if the triggering event occurs, the triggered event need not occur. Causality arrow 5, for example, could be of this type.

c) Simultaneous: For a "simultaneous"-type annotation, the triggering and triggered events must occur at the same time. Causality arrow 6, for example, could be of this type d) Conflict: For a "conflict"-type annotation, the triggering and triggered events must occur at a different time. Causality arrows 1 through 5, for example, could be of this type.

Although the preceding types of causality arrows are described, it can be appreciated that the annotation editor can be configured to create other types of annotations that circuit designers might find desirable. The annotations and their effect are based on the logical means by which a designer can graphically define a set of behaviors. Accordingly, adding other types of annotations to allow for other types of definitions is well within the skill in the art.

In another embodiment, an annotation may be a stability annotation, such as annotation 7 in FIG. 7. A stability annotation is a different kind of annotation than the causality arrows described above. A stability annotation specifies that a signal must remain at 0, 1, or any value N (where N can be a constant or a variable, a single bit or multiple bits) for a given amount of time. The time of the stability can be defined in terms of absolute time starting from one event (e.g., a given number of clock cycles since the rising edge of signal a) or in terms of relative time between two events (e.g., between the rising and falling edges of signal a). The stability annotation type annotation thus gives the designer yet another tool to specify graphically the criteria for the desired behavior.

Figure 8:
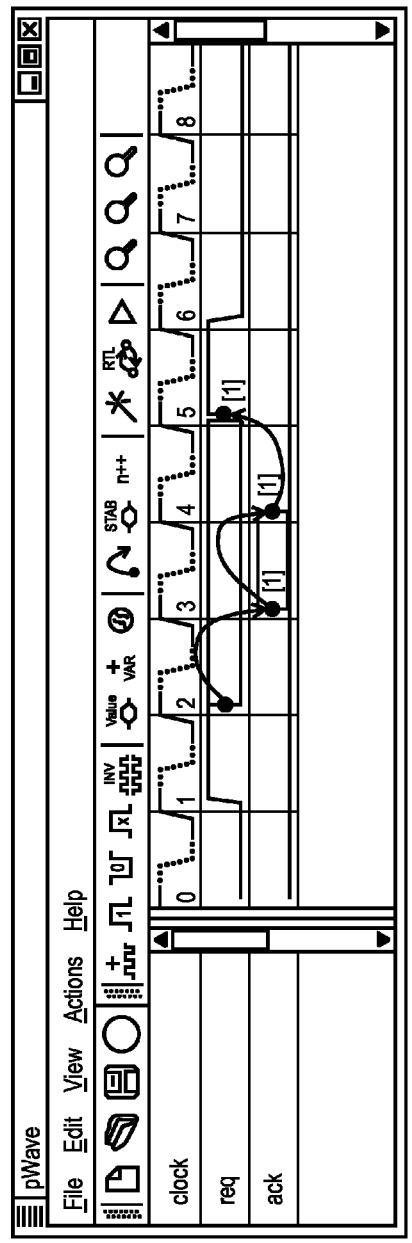
FIG. 8 shows a screen shot illustrating a stability annotation added to a waveform, in accordance with an embodiment of the invention.

FIG. 8 shows a screen shot illustrating a stability annotation added to a waveform, in accordance with an embodiment of the invention. Shown in this example are a request signal (req) and an acknowledge signal (ack). Based on the causality arrows added to the waveform in this example, the tool may infer two stability annotations. One stability annotation is shown as a shaded region for the req signal, and the other as a shaded region for the ack signal.

Figure 9:
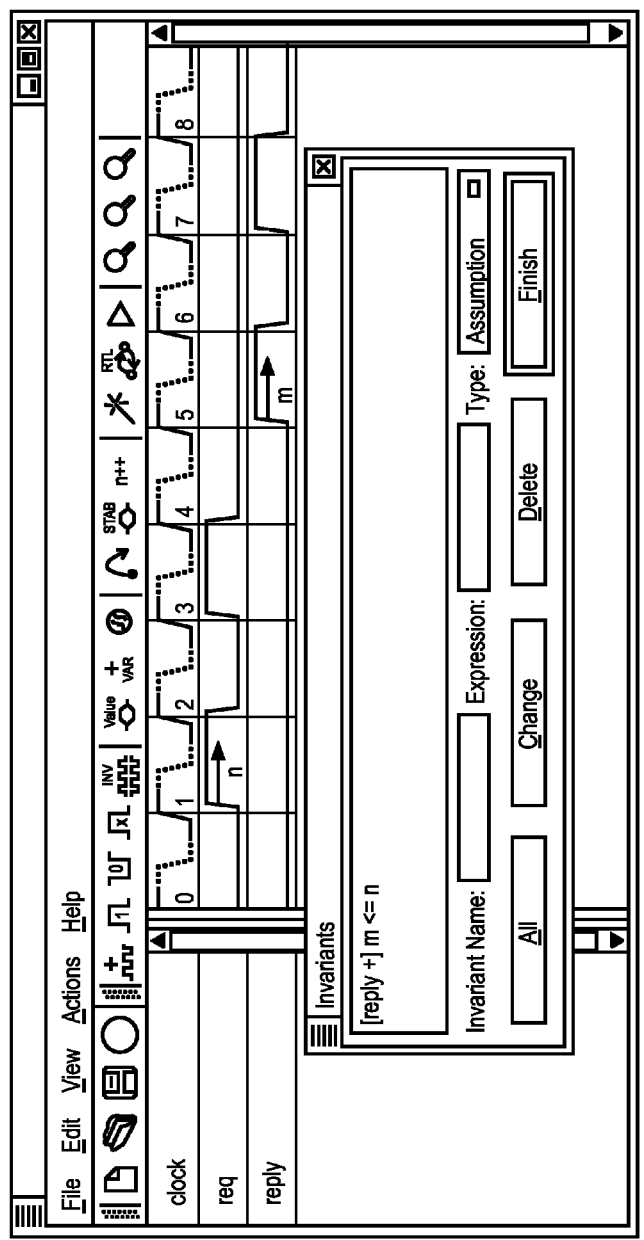
FIG. 9 shows a screen shot illustrating a counting annotation added to a waveform, in accordance with an embodiment of the invention.

A counting annotation describes a relationship that involves the number of occurrences of one or more events in the waveform. FIG. 9 shows a screen shot illustrating a counting annotation added to a waveform, in accordance with an embodiment of the invention. In this example, the waveform includes a request signal (req) and reply signal (reply). To implements the counting annotation, a counter n is created to count the number of times the signal req is asserted, and a counter m is created to count the number of times the signal reply is asserted. The annotation is then defined by the expression written in the pop-up dialog in FIG. 9 (i.e., "[reply+] m<=n"). As this expression is written, the rising edge of reply (reply+) is associated with the property m<=n. In other words, this expression mandates that whenever reply is asserted, the value of the counter m (the number of times reply is asserted) is less than or equal to the value of the counter n (the number of times req is asserted).

Figure 10:
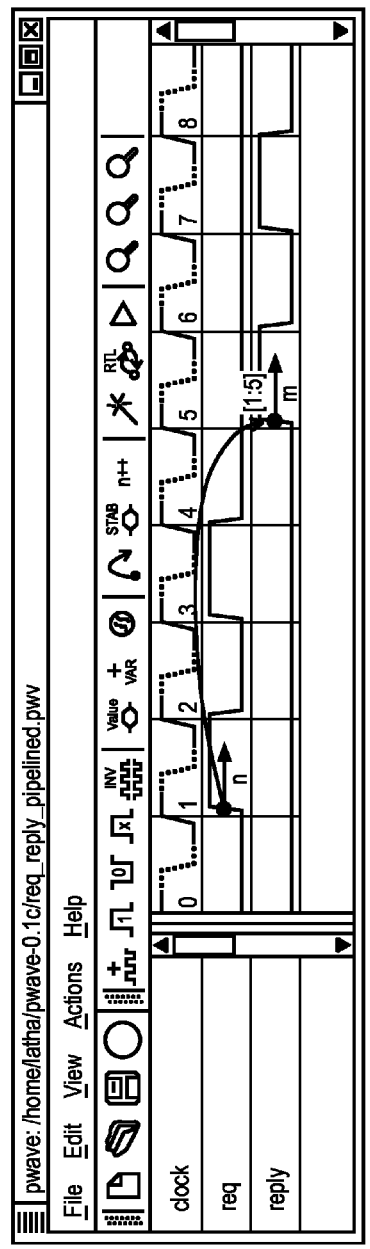
FIG. 10 is a screen shot illustrating an arrow tagging annotation resulting from a counting annotation and a causality arrow, in accordance with an embodiment of the invention.

An arrow tagging annotation is an annotation that can be inferred from counting annotations and causality arrows on a waveform. FIG. 10 is a screen shot illustrating an arrow tagging annotation resulting from a counting annotation and a causality arrow, in accordance with an embodiment of the invention. In this example, the waveform includes a request signal (req) and a reply signal (reply). Similar to the counting annotation example above, a counter n is created to count the number of times the signal req is asserted, and a counter m is created to count the number of times the signal reply is asserted. A causality arrow is added to constrain the waveform so that after the triggering event, the rising edge of req (req+), the triggered event, the rising edge of reply (reply+), occurs one to five clock cycles afterwards. The tool automatically detects that the triggering event of the causality arrow is tagged with counter n, and the triggered event is tagged with counter m. Accordingly, the tool applies the causality arrow to all occurrences of req+ and reply+ that have matching tags. This operation may be automatic or may require confirmation by the user.

Figure 11:
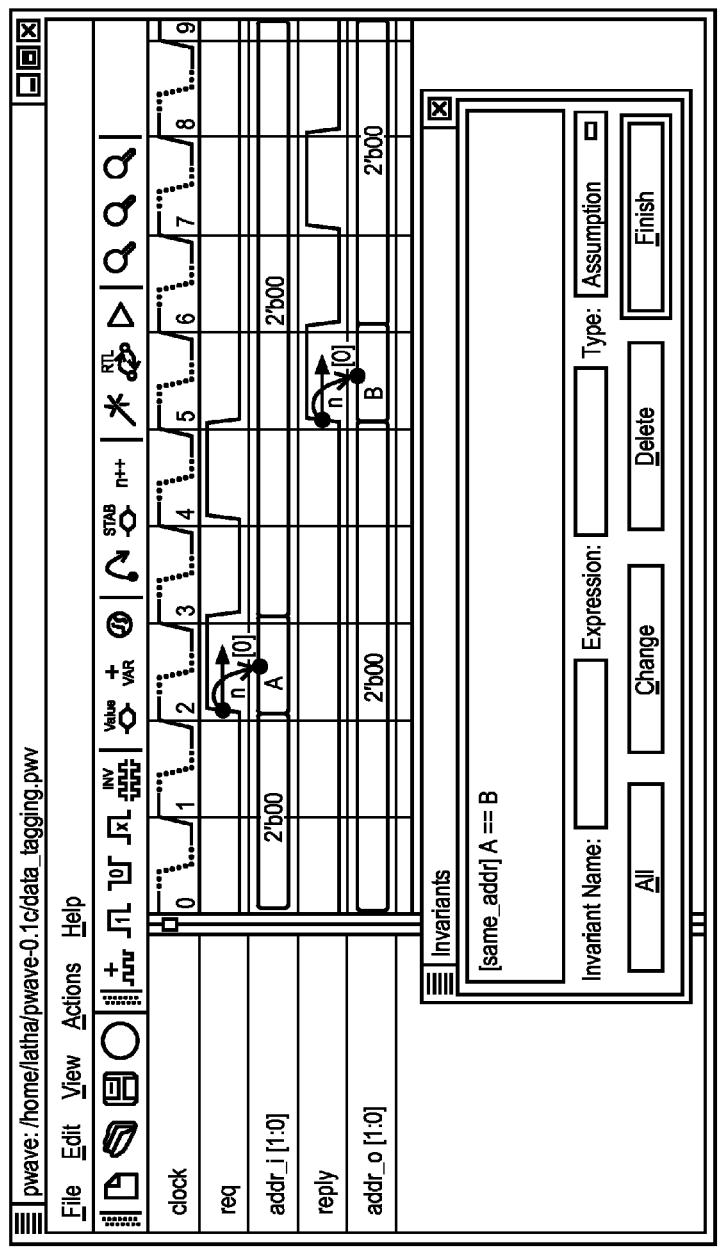
FIG. 11 is a screen shot illustrating a data tagging annotation being added to a waveform, in accordance with an embodiment of the invention.

A data tagging annotation is another type of annotation that can be inferred from counting annotations and causality arrows on a waveform. FIG. 11 is a screen shot illustrating a data tagging annotation being added to a waveform, in accordance with an embodiment of the invention. In this example, the waveform includes is a request signal (req) and a reply signal (reply). A counter n counts the number of times the req signal is asserted, while a counter m counts the number of times the reply signal is asserted. A causality arrow is added where the rising edge of req (req+) is the triggering event and the value of addr_i (A), a value event, is the triggered event. Another causality arrow is added from the rising edge of reply (reply+) to the value of addr_o (B). The tool automatically detects that triggering event reply+ for value event B is associated with counter m. The tool also detects that triggering event req+ for value event A is associated with counter n. The tool then generalizes the property A==B to all occurrences of value event A and B that have matching tags (or causality arrows). Using a pop-up dialog, the property, same_addr, is then added to state that A==B. In this way, the data tagging annotation required that the value of addr_i (A) is equal to the value of addr_o (B) at each matching pair of req+ and reply+.

The arrow tagging and data tagging annotations can be thought of as a general class of annotations called action annotations. Action annotations involve a triggering event and an action associated with the triggering event. For example, an arrow tagging annotation is an action annotation because it includes a triggering event and a counter. An arrow tagging annotation counts the number of occurrences of events similar to the triggering event and then tags each occurrence with a unique tag, often represented by an integer. Conceptually, the value of associated counter is assigned to an occurrence of the event, after which the counter is incremented. Accordingly, the next occurrence of the event will be tagged with a larger value. The value of the counter indicates how many similar events have occurred.

Figure 12:
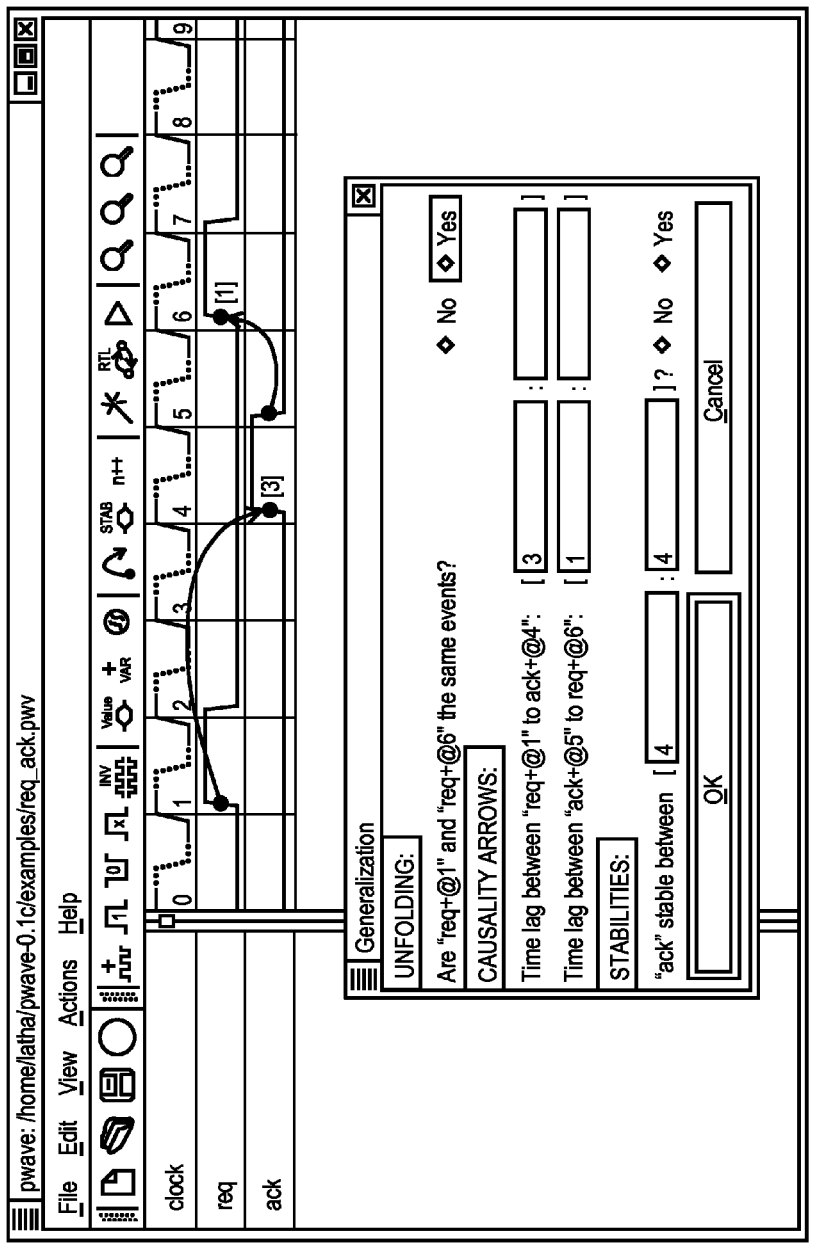
FIG. 12 is a screen shot illustrating how an unfolding annotation can be added to a waveform, in accordance with an embodiment of the invention.

Yet another class of annotations is unfolding annotations. An unfolding annotation contains two events that are to be considered the same event by unfolding the annotated waveform. This allows a user to define an unfolding point, which is a time when the waveform should repeat itself, which allow the user to specify the condition of repeating sequences. FIG. 12 is a screen shot illustrating how an unfolding annotation can be added to a waveform, in accordance with an embodiment of the invention. This example illustrates two events on the waveform that the user indicates are the same event (i.e., an earlier event is a repetition at a later cycle of the latter event): The rising edge of req at time 1 and the rising edge of req at time 6 are the same event.

In one embodiment, these annotations capture positive behaviors into the behavior data store. In other embodiments, in addition to specifying from among the various types of annotations, the annotation editor can specify the effect of the annotation, such as positive behavior, negative behavior, assumption, positive assertion, and negative assertion, depending on the target applications of the acquisition annotations.

In one embodiment, once the designer has finished editing the annotated waveform, an annotation generalizer attempts to generalize the annotations so they apply as broadly as possible. Causality arrow annotations can be generalized by changing the time interval and/or the optional guard. The time interval of a causality arrow defaults to the constant value shown in the waveform, but the user can adjust the time interval to any range as described above.

Figure 13:
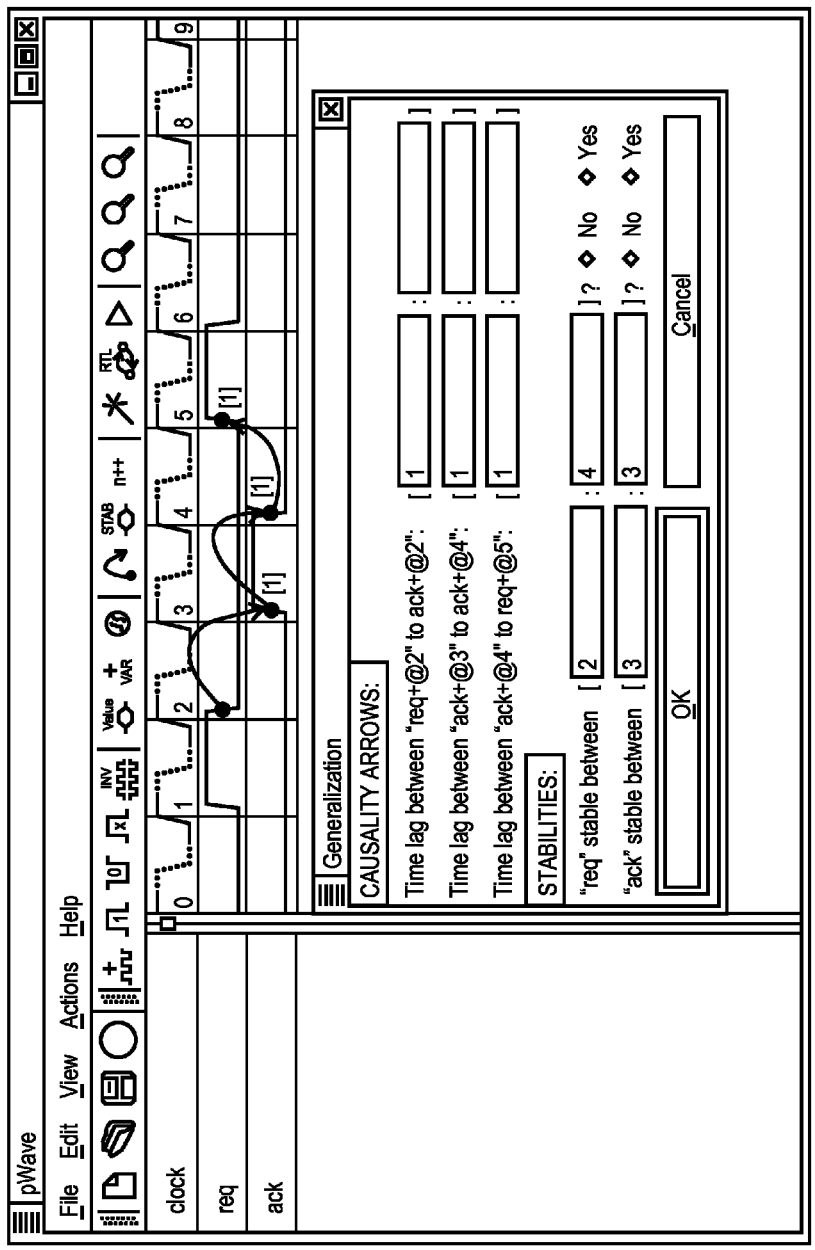
FIG. 13 is a screen shot of the generalization of a stability annotation, in accordance with one embodiment.

If the annotation is a stability annotation, other types of generalizations may apply. In one embodiment, for a stability annotation, the user is prompted to specify the time during which the signal is to remain at the value. The time may be a constant or a variable, (based, for example, on the value of another signal). The user may also be prompted to specify a condition of the signal that must be true during this time period. For a multiple bit signal, for example, that user may generalize the stability annotation so that it requires the signal to stay within a given range during the time period rather than stay exactly at the particular value. FIG. 13 is a screen shot of the generalization of a stability annotation, in accordance with one embodiment. Using the dialog in this user interface, a user can specify generalizations such as whether the value of each signal is stable and for how long it should be stable. For example, the value of req is stable at 0 from clock cycle 2 to clock cycle 4, and the value of ack is stable at 1 for the third clock cycle.

Recipe and Behavior Extraction and Comparison

Embodiments of the invention automatically add structural information regarding the design or executable description into the indexed data store 130 as recipes, behaviors, and as placeholders for the user to enter textual descriptions for the structural elements that can be used as recipes and behaviors. The resulting data store 130 acts as documentation for the design, and embodiments of the invention guide the user to add textual description in that documentation.

In one embodiment, the executable description for the circuit design is analyzed and information from it is extracted. In one example, the extracted information includes one or more of: input list at the top module; output list at the top module; flop list within the description; latch list within the description; and assumption, assertion, and functional coverage points embedded inside the description.

The lists are then classified into categories. For example, flops and latches may be classified into finite-state-machine (FSM), counter, FIFO, memory, delay buffer, or the like. Assumptions, assertions, and functional coverage points are classified according to their hierarchical locations or PSL unit association. An example of how to automatically classify a counter is captured in U.S. Pat. No. 7,418,678, which is incorporated by reference in its entirety. Using these classifications, these extracted items are associated into a tree format, with the finite-state-machine items being the children of a node labeled "FSM", etc. The tree is then presented to guide the designer for further rearrangement and for addition of textual descriptions. The resulting information is then presented to the user as a "live" specification document for the design, and for other operations appropriate for an indexed database. The tree structure may be displayed as a table of content of this live specification, while tree with children becomes a chapter or section in the documentation, and the individual items with their associated textual description shown in a bulletized list.

The extraction described herein may be applied to multiple revisions of the design. For example, each extracted item is classified as baseline, obsolete, recently added, or recently deleted. This classification is performed according to the following procedure:

a) given a design revision A, extract the items AIs and mark them as baseline b) given a design revision B, extract the items BIs c) if an item in BIs is already in AIs, mark them as baseline d) if an item in BIs is not in AIs, mark them as recently added e) if an item in AIs is not in BIs, mark them as recently deleted f) at this point the user has the option to set the current information as "baseline", which will change 1) any item with classification "recently added" to baseline, 2) any item with classification "recently deleted" as "obsolete"

g) at this point, the invention can receive another design revision C, extract the items CIs.

h) If an item in CIs is already in the database, marked as "baseline", there is no change in classification i) If an item in CIs is already in the database, marked as "obsolete", its classification is changed to "recently added"

j) If an item in CIs is not in the database, its classification is "recently added"

k) If an item marked as "baseline" in the database is not in CIs, its classification is changed to "recently deleted"

l) If an item marked as "obsolete" in the database is not in CIs, its classification remains as "obsolete".

Apart from performing these classifications and enabling the user to rearrange the information into a document, each item is used as a standalone recipe to create waveform for the executable specification, from which further behaviors and recipes can be derived.

Recipe Manipulation

Embodiments of the invention facilitate the capture of recipes for use by one or more of the behavior analysis tools 140. In these embodiments, behaviors obtained during the behavioral indexing process are used to generate waveforms similar to the system and process, as described in U.S. Pat. No. 7,421,668, which is incorporated by reference in its entirety.

Figure 14:
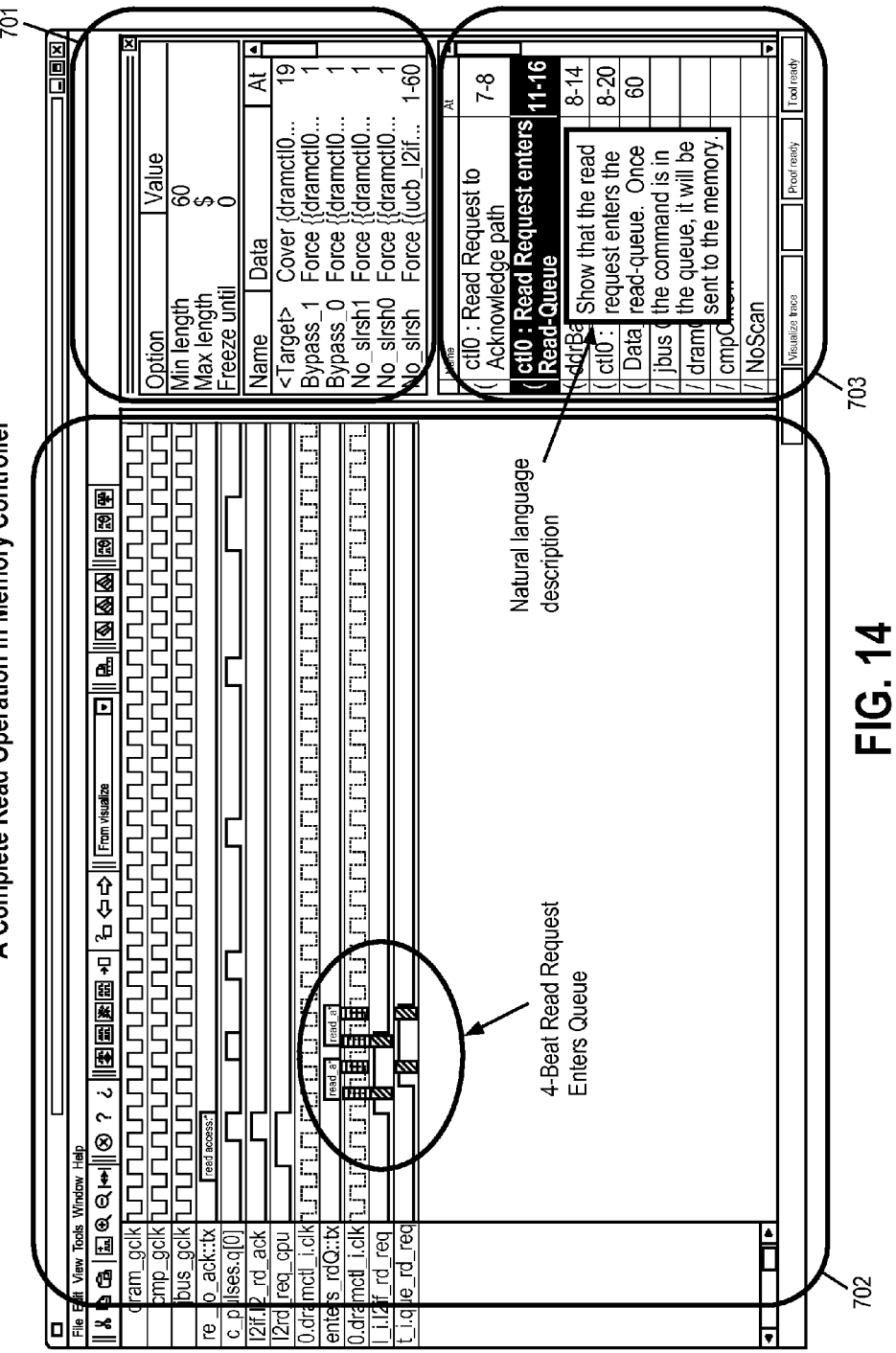
FIG. 14 illustrates one embodiment of a technique for recipe manipulation during the behavioral indexing process.

FIG. 14 illustrates one embodiment of a technique for recipe manipulation during the behavioral indexing process. As shown, next to the waveform, the recipe that was used to generate the current waveform is displayed in 701. The current set of behaviors in the data store 130 is located in the form of a table 703. Behaviors exercised in the current waveform are highlighted with a special color, while the other behaviors remain to have white background.

In one embodiment, a user may drag and drop a behavior from the behavior table to the recipe area to modify the current recipe. In addition, as described in U.S. Pat. No. 7,421,668, the user may select specific signal/cycle pairs in the waveform area 702, and click some of the buttons to modify the recipe. In addition, the user interface also enables the user to start the waveform generation computation on the design (rather than the requirement without design as in U.S. Pat. No. 7,421,668) from the modified recipe, and then replaces the current waveform with the revised waveform when the computation is done. U.S. Pat. No. 7,421,668 explains how the resulting recipes can be used to generate a waveform.

Waveform Comprehension

Figure 15:
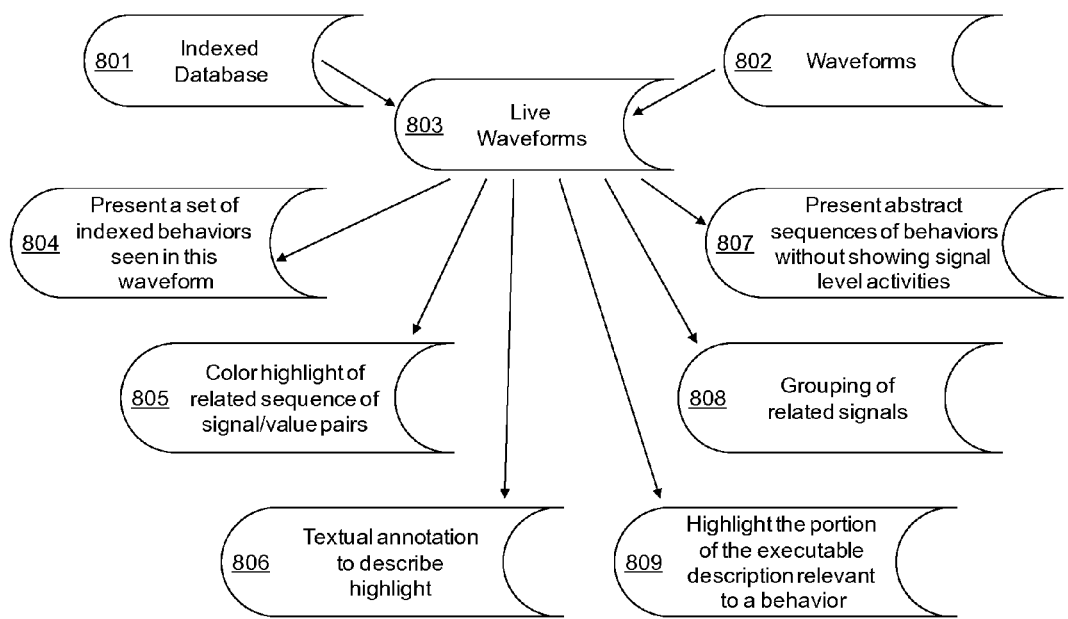
FIG. 15 illustrates a process for using an indexed database to convert a waveform into a live waveform.

In one embodiment, one of the behavior analysis tools 140 is a tool for using the circuit behavior data store 130 to aid in waveform comprehension. FIG. 15 illustrates a process for using an indexed database 801 to convert a waveform 802 into a live waveform 803. Note that the "live annotations" on a live waveform are for comprehension purposes and are different from the "behavior acquisition annotations", which are for behavior acquisition purposes. A live waveform uses the information in the indexed database to highlight interesting activities and push relevant textual description to the user trying to comprehend the waveform.

Figure 16:
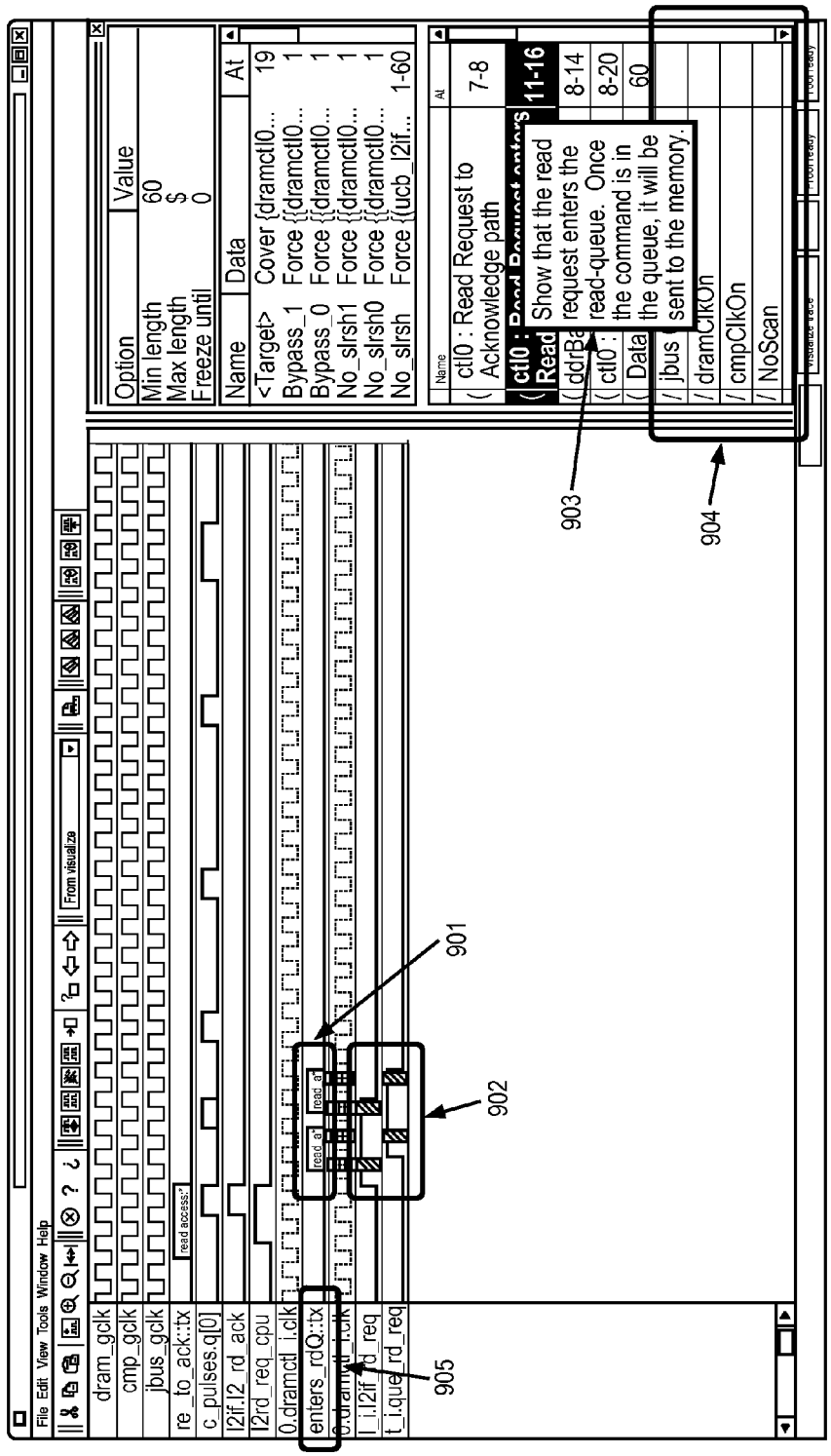
FIG. 16 illustrates the components of FIG. 15.

This is further explained in FIG. 16, which shows the components of FIG. 15. As shown, a list of behaviors exercised by the current waveform 804 is listed in a table form 904 as entries with non-white background, whereas the behaviors not exercised by the current waveform have white background. Color highlight of the sequence of signal activities 805 is shown in the waveform 902. These signals are grouped together 808 and can be hidden or shown by double-clicking the rectangle 901 representing a high-level view 807 with the duration in which the behavior is exercised by the waveform. The textual description of a behavior 806 can be shown as tool-tip in the GUI for the entry in the behavior table 903, or tool-tip for the rectangle 901, or the name of the rectangle 905.

Figure 17:
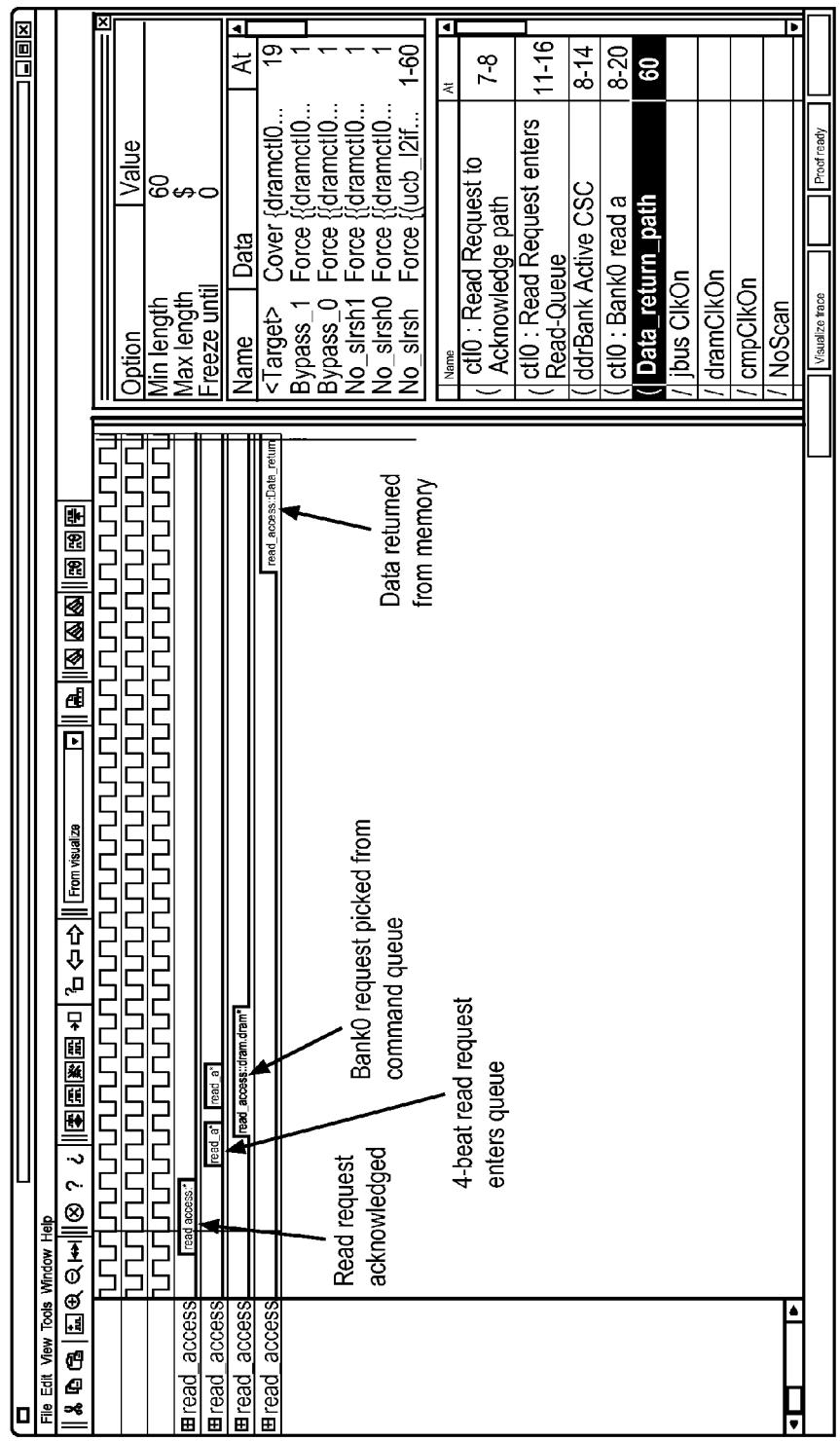
FIG. 17 illustrates an example of how the sequence of abstract behaviors can be shown on the waveform as rectangles instead of the detailed signal level activities.

FIG. 17 illustrates another example of how the sequence of abstract behaviors 807 can be shown on the waveform as rectangles instead of the detailed signal level activities. The abstract behaviors are shown as a rectangle with begin time, end time, and possibly with attributes, expandable into the actual list of "variable/time-step highlight."

Figure 18:
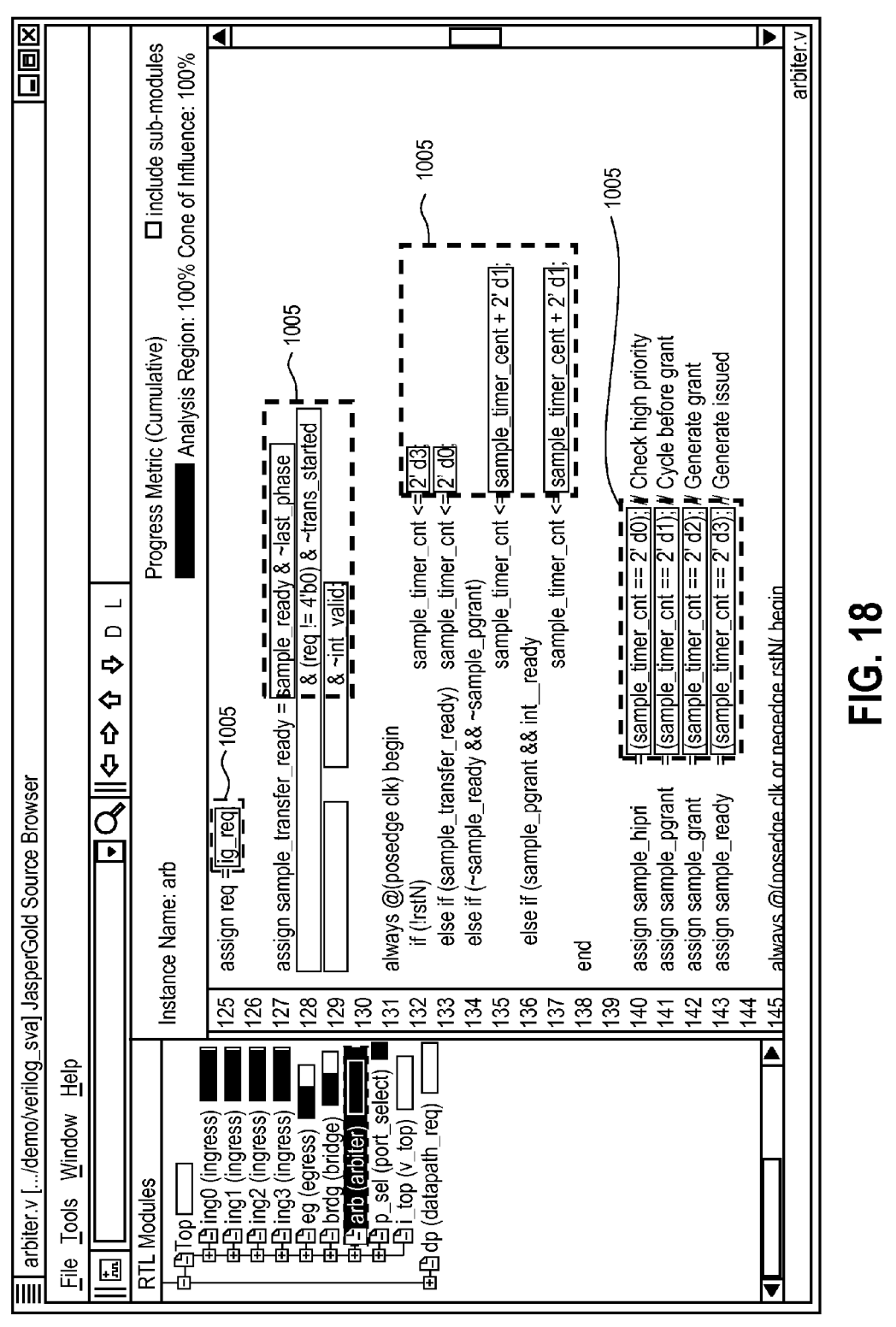

FIG. 18 is a screen shot showing how the cone-of-influence 1005 is highlighted with respect to a behavior when a behavior is selected from an entry in the behavior table or a rectangle in the waveform. The relevant logic area of the design, with respect to the current waveform and recipe, can also be highlighted similarly.

Design Comprehension

Figure 19:
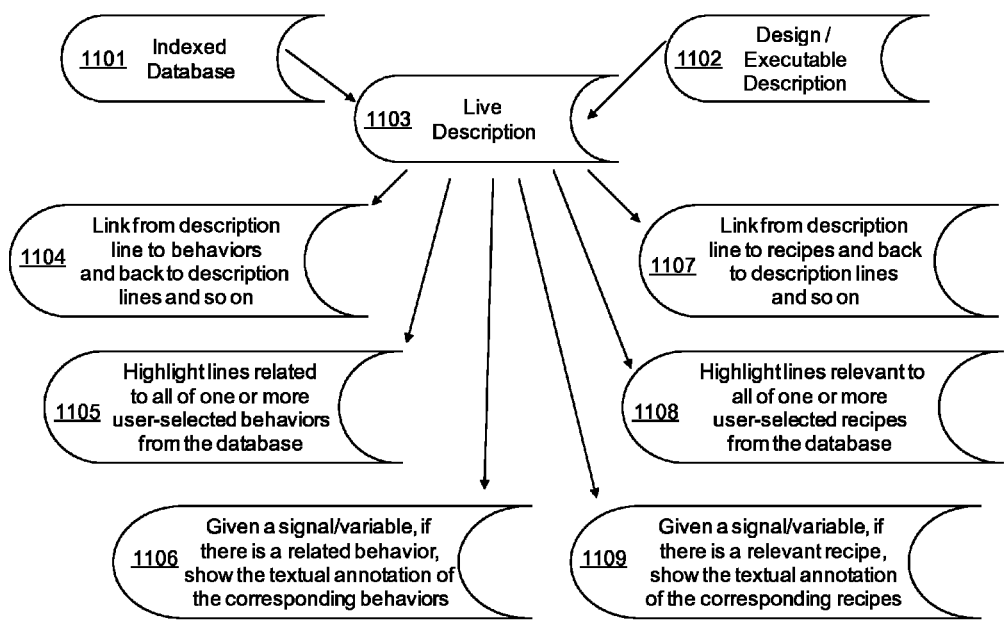
FIG. 19 illustrates a process for using an indexed database to convert a design into a live description.

In one embodiment, one of the behavior analysis tools 140 is a tool for using the circuit behavior data store 130 to aid in waveform comprehension. FIG. 19 illustrates a process for using an indexed database 1101 to convert a design 1102 into a live description 1103. As described above, embodiments of the invention compute the cone-of-influence of each behavior in the data store 130, and the relevant logic of each waveform generated from a recipe in the data store 130. This enables mapping of each line of the description to a set of behaviors and a set of recipes, if the behavior has the line of the description in the cone-of-influence, or if the recipe has the line of description in the relevant logic area.

Component 1104 describes this mapping of a line of the description to the list of behaviors and then to the cone-of-influence of any of these behavior. Component 1105 describes the highlight of the lines in the cone-of-influence of an indexed behavior. Component 1106 extends component 1104 to not just show the list of behaviors related to a line of the description, but also show the textual description from the database for these behaviors. Similarly components 1107, 1108, and 1109 describe the mapping of a line of the description to the list of recipes and then to the relevant logic of any of these recipes.

Figure 20:
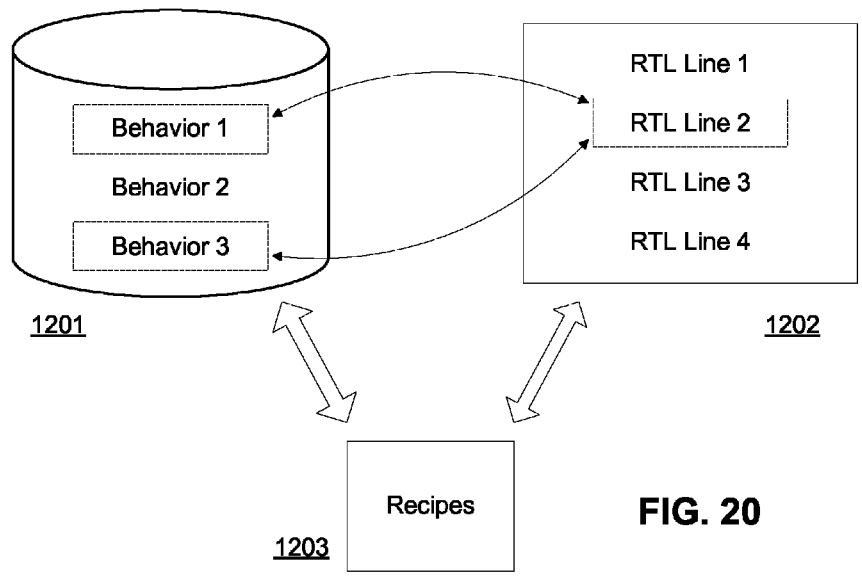
FIG. 20 shows indexed behaviors in the database can be mapped to line highlights of an executable description, and from there mapped back to the list of related behaviors in the database.

FIG. 20 shows indexed behaviors 1201 in the database can be mapped to line highlights of the RTL description 1202, and from there can be mapped back to the list of related behaviors 1201 in the database. Furthermore, as described above, a recipe can be created from a line of the description 1202 or from a behavior 1201 in the database, or from an existing recipe 1203 to generate new waveforms.

Finally, the behaviors can be tagged with a common "high-level description," so that the user is presented with a set of "high-level description" instead of the detailed list of behaviors. This may be particularly useful when the behavior database contains many behaviors. The behavior groups, each tagged with a common "high-level description," can overlap and share common behaviors.

Expandable and Evolvable Document

In one embodiment, one of the behavior analysis tools 140 is a tool for using the circuit behavior data store 130 as an expandable document, in contrast to a traditional document, which is static and limited to what the original authors have put into the write-up. The tool 140 may also use the circuit behavior data store 130 as an evolvable document, in contrast to a traditional document, which is static and difficult to be updated to make the latest revision of an evolving executable description.

Figure 21:
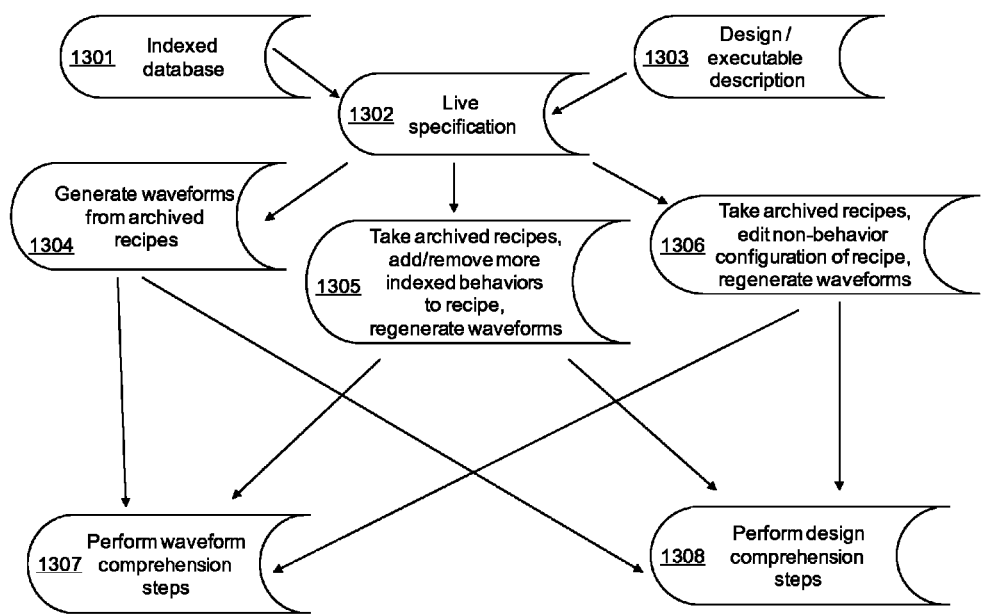
FIG. 21 illustrates a process for using the behavioral index database as a live expandable specification of the executable description.

FIG. 21 illustrates a process for using the behavioral index database 1301 as a live expandable specification 1302 of the executable description 1303. While the database contains a finite number of indexed behaviors and recipes, the invention allows the user to generate waveforms that might not have been considered by the original person populating the database. Each recipe in the database can be used to generate a waveform from the design 1304, and yet, they can be customized by adding or removing behaviors from the recipe 1305, and adding or removing non-behavior configuration of recipes, such as minimum length and maximum length 1306.

These waveforms, converted into live waveforms with the circuit behavior data store 130, may contain many annotations as described above, and can be used as if someone has spent the time writing down the explanation of the design with respect to the waveforms, even though the original person populating the database may have never seen these waveforms.

Figure 22:
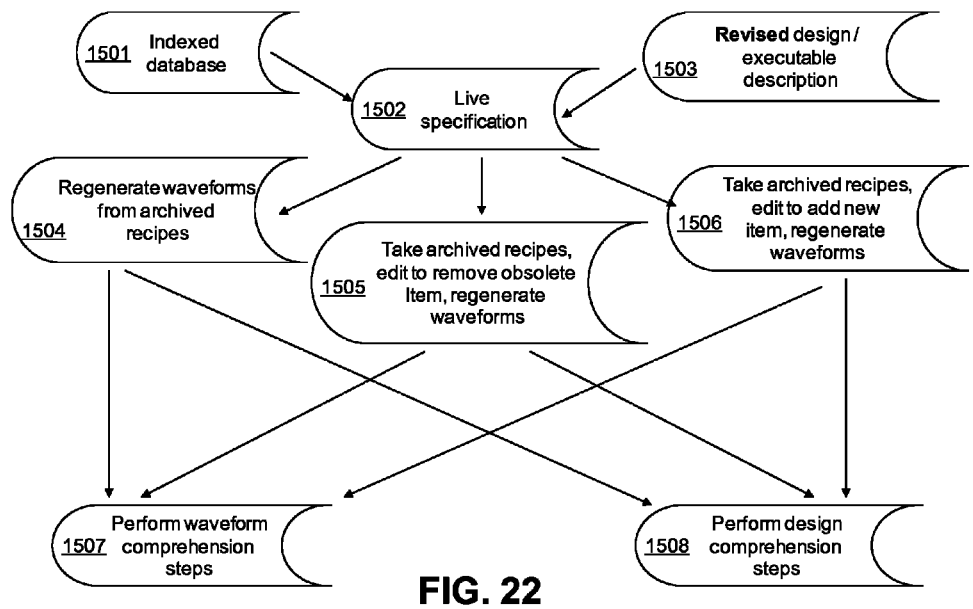
FIG. 22 illustrates a process for using the behavioral index database as a live evolvable specification of an evolving executable description with revisions.

Similarly, FIG. 22 illustrates a process for using the behavioral index database 1501 as a live evolvable specification 1502 of an evolving executable description with revisions 1503. While the indexed behaviors and recipes in the database were originally created with respect to one version of the design, as long as the signals or variables referenced by the executable descriptions of the behaviors and recipes are still in another version of the design, a revised waveform 1504 can be regenerated from the recipe by analyzing the revised design 1503. While this waveform may be different from the waveform generated from the same recipe using the original version of the design, and while the original creator of the recipe may have never seen this revised design, this waveform is actually an up-to-date description of what the revised design can do. These recipes can be modified 1505 and 1506, similar to how they can be modified in the previous FIGS. 1305 and 1306, allowing customization of the recipes for the revised and evolved design.

These waveforms, converted into live waveforms with the behavioral indexed database, may contain many annotations as described above, and can be used as if someone has spent the time writing down the explanation of the revised design with respect to the waveforms, even though the original person populating the database may have never seen these waveforms or the revised design.

Accordingly, embodiments of the invention overcome the usual difficulty of maintaining a static document, are comprehensive enough to cover what the various users of the document may want to know, and can be constantly updated to match and describe recent revisions to the design.

Isolation Analysis

Figure 23:
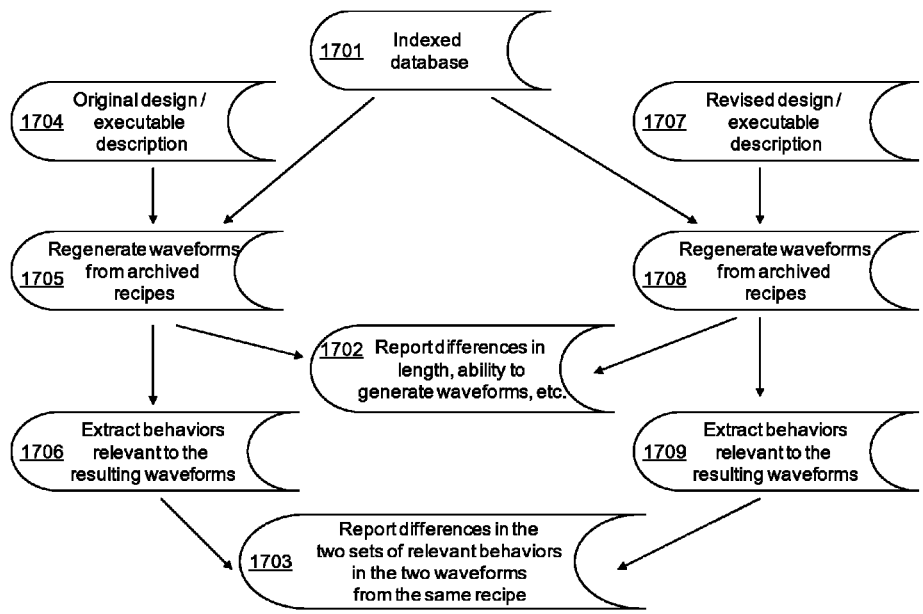
FIG. 23 illustrates an embodiment of the invention for using the circuit behavior data store to identify the differences between two versions of the design.

In one embodiment, one of the behavior analysis tools 140 is a tool for using the circuit behavior data store 130 to isolate the difference between two revisions of an executable description and summarize the implication of the changes that have been made to revise the description. FIG. 23 illustrates an embodiment of the invention for using the circuit behavior data store 130 to identify the differences between two versions of the design. Taking the original design 1704 and the revised design 1707, the recipes in the database 1701 are used to regenerate 1705 1708 two sets of waveforms, one from each version of the design. A basic report is presented 1702 to the user regarding the differences in trace lengths, or even whether the recipe was able to create a waveform or not for one of the design.

In one embodiment, the set of behaviors are checked in the data store 130 to extract 1706 1709 the subset that is actually exercised by each generated waveform. A behavioral difference report is presented 1703 to the user regarding the differences in exercised behaviors for the two waveforms from the same recipe, applied to the two versions of the design.

In one embodiment, a coverage measurement is extracted from each generated waveform regarding the size of the relevant logic when compared to the full cone-of-influence or the full design, and a coverage report is presented to the user regarding the difference in coverage measurement for the two waveforms from the same recipe, applied to the two versions of the design. A cumulative coverage measurement, one for each of the design versions, is also presented to the user.

Figure 24:
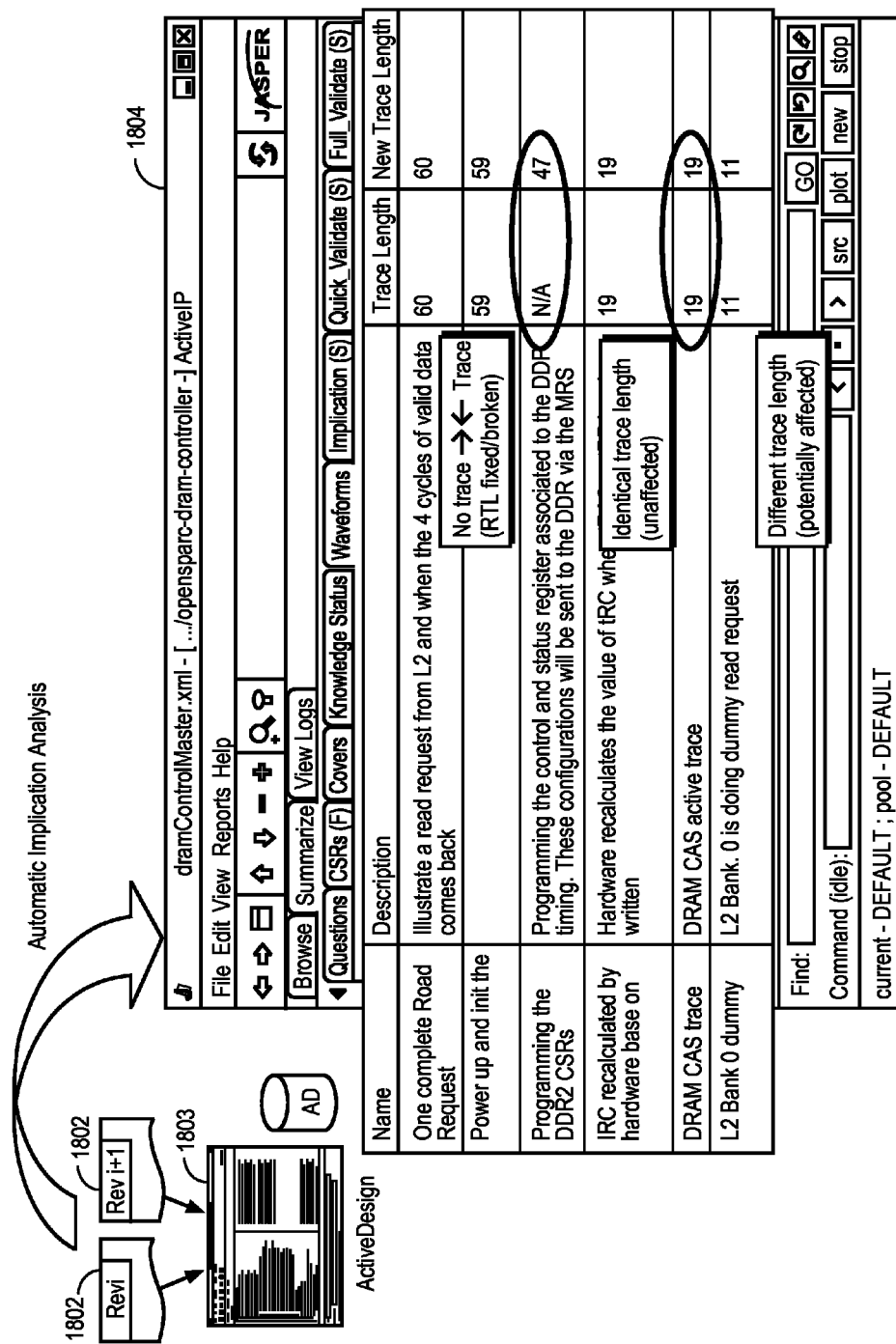
FIG. 24 illustrates one embodiment of the invention that takes two versions of the design, performs the analysis shown in the previous figure, and presents the results in table form.

FIG. 24 illustrates one embodiment of the invention that takes two versions of the design 1801 and 1802, performs the analysis shown in the previous FIG. 1803, and presents the results in table form 1804. As illustrated, each recipe shows data in one row and with columns such as trace length for each version of the designs, the ability to generate waveform from the recipe, coverage measurement, and exercised behaviors.

If the circuit behavior data store 130 contains concrete waveforms, usually generated from the recipes in the first version of the design, embodiments of the invention will also present whether the waveforms can be reproduced on the revision of the design, by applying the same inputs that are captured in the waveform to the revised design, and checking if the configuration and behaviors of the same recipe is still satisfied in the resulting waveform.

Programming Sequence Manipulation

In one embodiment, one of the behavior analysis tools 140 is a tool for using the circuit behavior data store 130 to create applicable programming sequences and to confirm the effect of user-supplied programming sequences.

Figure 25:
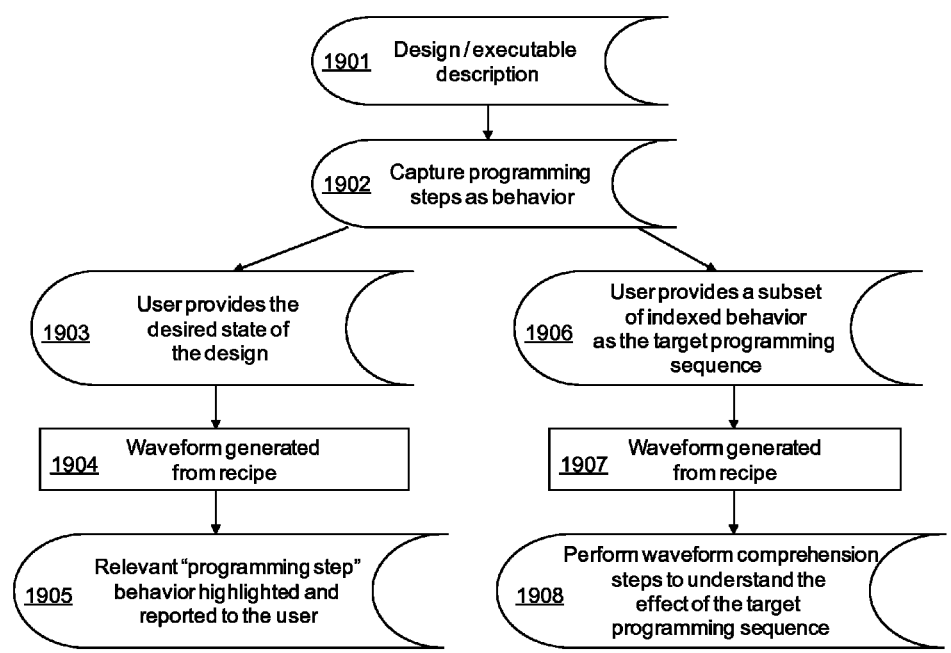
FIG. 25 illustrates a process for capturing programming steps for a design as behaviors in a behavioral index database.

FIG. 25 illustrates a process for capturing programming steps for a design 1901 as behaviors in a behavioral index database 1902. For example, if a design is programmable through an interface with signals "valid", "write", "addr", and "data", a programming step may be specified by the following sequence "valid && write && addr==32'b0000abcd ##1 data==32'b0000cdef", which says, if valid and write both have value 1, and the current value of addr is abcd, while data has value cdef, this captures an action by the environment of the design to write data cdef to the control register abcd. By composing 1906 these behaviors that represent the programming steps into a recipe, embodiments of the invention generate 1907 waveforms from the executable description. The user can use 1908 tools described above to understand the various effect on the behavior of the design with respect to the programming sequence captured in the recipe.

Embodiments of the invention also allow the user to specify 1903 the desired state of the design as a behavior in a recipe, and by generating 1904 waveforms from this recipe, and using tools described above to highlight the behaviors exercised by this generated waveform, any programming steps represented by the exercised behaviors will be presented 1905 to the user. This sequence of abstract behaviors is converted to the actual programming sequence that can be used to program the design into the desired state.

Summary

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Embodiments of the invention may also relate to a computer data signal embodied in a carrier wave, where the computer data signal includes any embodiment of a computer program product or other data combination described herein. The computer data signal may be embodied in a product, where the signal is presented in a tangible medium or carrier wave and modulated or otherwise encoded in the carrier wave, and transmitted according to any suitable transmission method. The computer data signal product may be produced or made according to any of the processes described herein.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A computer-program product comprising a non-transitory computer-readable storage medium storing computer-executable code for aiding in the comprehension of a circuit design, the code when executed by a computer processor causes the processor to perform the method comprising:
receiving an executable description of the circuit design;
accessing a data store, the data store including a plurality of behaviors associated with the circuit design that are acquired from waveform annotations added to one or more displayed waveforms of the circuit design, the waveform annotations representing graphical explanations of the behaviors;
receiving a behavior of the plurality of behaviors from the data store;
identifying lines of the executable description that can affect the behavior;
displaying the executable description of the circuit design; and
highlighting, in the displayed executable description, the identified lines of the executable description that can affect the behavior.

2. The computer-program product of claim 1, wherein the computer-readable storage medium further stores computer executable code that when executed by the computer processor causes the processor to perform the steps of:
identifying other behaviors from the plurality of behaviors in the data store that can be affected by the identified lines of the executable description;
displaying a list of the plurality of behaviors from the data store; and highlighting, in the list of the plurality of behaviors, the other behaviors.

3. The computer-program product of claim 1, wherein identifying lines of the executable description that can affect the behavior comprises identifying lines of the executable description that are in a cone-of-influence of the behavior.

4. The computer-program product of claim 1, wherein the computer-readable storage medium further stores computer executable code that when executed by the computer processor causes the processor to perform the steps of:
displaying a textual description of the behavior.

5. The computer-program product of claim 1, wherein the computer-readable storage medium further stores computer executable code that when executed by the computer processor causes the processor to perform the steps of:
displaying a high level description of the behavior.

6. The computer-program product of claim 1, wherein the executable description of the circuit design is for a revised version of the circuit design and the plurality of behaviors in the data store are acquired from waveform annotations added to one or more displayed waveforms of one or more previous versions of the circuit design.

7. A computer-program product comprising a non-transitory computer-readable storage medium storing computer-executable code for aiding in the comprehension of a circuit design, the code when executed by a computer processor causes the processor to perform the method comprising:
receiving an executable description of the circuit design;
accessing a data store, the data store including a plurality of recipes for the circuit design, each recipe comprising at least one behavior one or more behaviors associated with the circuit design acquired from waveform annotations added to one or more displayed waveforms of the circuit design, the waveform annotations representing graphical explanations of the behaviors;
receiving a recipe of the plurality of recipes from the data store;
generating another waveform of the circuit design from the recipe;
identifying lines of the executable description that can affect signals of the another waveform;
displaying the executable description of the circuit design; and
highlighting, in the displayed executable description, the identified lines of the executable description that can affect the signals of the another waveform.

8. The computer-program product of claim 7, wherein identifying lines of the executable description that can affect the signals of the another waveform comprises identifying lines of the executable description that are relevant to the another waveform.

9. The computer-program product of claim 7, wherein identifying lines of the executable description that can affect the signals of the another waveform comprises identifying lines of the executable description that are in the cone of influence of the recipe.

10. The computer-program product of claim 7, wherein each of the plurality of recipes also comprises associated configuration information.

11. The computer-program product of claim 7, wherein the executable description of the circuit design is for a revised version of the circuit design and the one or more behaviors in the data store are acquired from waveform annotations added to one or more displayed waveforms of one or more previous versions of the circuit design.

12. A computer-program product comprising a non-transitory computer-readable storage medium storing computer-executable code for aiding in the comprehension of a circuit design, the code when executed by a computer processor causes the processor to perform the method comprising:

receiving an executable description of the circuit design;

accessing a data store, the data store including a plurality of behaviors for the circuit design that are indexed to a plurality of textual descriptions of the behaviors, wherein the textual descriptions are textual comments describing the behaviors;

displaying the executable description of the circuit design;

receiving a selection of a line of the executable description of the circuit design;

identifying a behavior from the plurality of behaviors that can be affected by the selected line of the executable description; and displaying a textual description from the plurality of textual descriptions that is indexed to the identified behavior.

13. The computer-program product of claim 12, wherein identifying behaviors that can be affected by the selected line comprises identifying behaviors that are in a fan-out of the selected line of the executable description.

14. The computer-program product of claim 12, wherein the computer-readable storage medium further stores computer executable code that when executed by the computer processor causes the processor to perform the steps of:

displaying a high level description for the identified behavior.

15. The computer-program product of claim 12, wherein the plurality of behaviors in the data store are acquired from waveform annotations added to one or more displayed waveforms of the circuit design.

16. The computer-program product of claim 12, wherein the behaviors are actions and reactions associated with the executable description of the circuit design.

* * * * *

UNITED STATES PATENT AND TRADEMARK OFFICE
CERTIFICATE OF CORRECTION

PATENT NO. : 8,527,911 B1  
APPLICATION NO. : 12/797471  
DATED : September 3, 2013  
INVENTOR(S) : Kathryn Drews Kranen et al.

Page 1 of 1

It is certified that error appears in the above-identified patent and that said Letters Patent is hereby corrected as shown below:

Title Page, Item (57) Abstract, line 11, replace "facilities" with --facilitates--.

In the Claims

Column 18, lines 29-30, after "each recipe comprising" delete "at least one behavior".

Signed and Sealed this
Eighteenth Day of November, 2014

Michelle K. Lee
*Deputy Director of the United States Patent and Trademark Office*